US011287739B2

(12) United States Patent
Nakamura

(10) Patent No.: US 11,287,739 B2
(45) Date of Patent: Mar. 29, 2022

(54) PHOTOSENSITIVE COLORING COMPOSITION, CURED FILM, COLOR FILTER, SOLID-STATE IMAGING ELEMENT, AND IMAGE DISPLAY DEVICE

(71) Applicant: FUJIFILM Corporation, Tokyo (JP)

(72) Inventor: Shoichi Nakamura, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 179 days.

(21) Appl. No.: 16/504,745

(22) Filed: Jul. 8, 2019

(65) Prior Publication Data

US 2019/0332008 A1 Oct. 31, 2019

Related U.S. Application Data

(63) Continuation of application No. PCT/JP2018/005367, filed on Feb. 16, 2018.

(30) Foreign Application Priority Data

Mar. 24, 2017 (JP) .............................. JP2017-059846
Feb. 2, 2018 (JP) .............................. JP2018-017285

(51) Int. Cl.
G03F 7/00 (2006.01)
G03F 7/004 (2006.01)
C09B 48/00 (2006.01)
C09B 19/00 (2006.01)
G02B 5/22 (2006.01)
C08F 2/44 (2006.01)

(52) U.S. Cl.
CPC ............ *G03F 7/0007* (2013.01); *C09B 19/00* (2013.01); *C09B 48/00* (2013.01); *G02B 5/223* (2013.01); *G03F 7/004* (2013.01); *C08F 2/44* (2013.01)

(58) Field of Classification Search
CPC ........ G03F 7/0007; G03F 7/031; G03F 7/027; G03F 7/004; G03F 7/092; G03F 7/039; G03F 7/0397; G03F 7/322; G03F 7/16; G03F 7/0392; G03F 7/105; G03F 7/2002; G03F 7/32; G03F 7/40; G03F 7/0045; G03F 7/0047; G03F 7/033; G02F 1/133516; G02F 1/133514; G02B 5/23; G02B 5/20; G02B 5/223; G02B 1/04; G02B 5/201; G02B 5/208; C09B 19/00; C09B 48/00; C09B 69/103; C09B 69/105; C09B 69/106; C09B 69/109; C08F 2220/286; C08F 220/20; C08F 2220/185; C08F 2/44; C08F 12/20; C08F 12/26; C08F 12/30; C08F 12/32; C08F 220/06; C08F 290/12; C08F 2220/283; C08F 2220/382; C07D 263/14

See application file for complete search history.

(56) References Cited

U.S. PATENT DOCUMENTS

| | | | | |
|---|---|---|---|---|
| 2003/0054266 A1* | 3/2003 | Hatakeyama | .......... | G02B 5/201 430/7 |
| 2011/0003241 A1* | 1/2011 | Kaneko | .................... | C09D 7/45 430/7 |
| 2014/0120473 A1* | 5/2014 | Aoyagi | ............. | H01L 27/14621 430/285.1 |
| 2015/0338733 A1* | 11/2015 | Kaneko | ............. | G02F 1/133516 252/586 |
| 2016/0016919 A1* | 1/2016 | Norizuki | ............... | G03F 7/0007 430/17 |

FOREIGN PATENT DOCUMENTS

| | | | | |
|---|---|---|---|---|
| JP | 2006-98684 A | 4/2006 | | |
| JP | 2008-038061 A | 2/2008 | | |
| JP | 2009203462 A | * 9/2009 | .......... | C09B 67/009 |
| JP | 2010-210924 A | 9/2010 | | |
| JP | 2012-078409 A | 4/2012 | | |
| JP | 2012-173550 A | 9/2012 | | |
| JP | 2012-208374 A | 10/2012 | | |
| JP | 2013-77009 A | 4/2013 | | |
| JP | 2013-254047 A | 12/2013 | | |
| JP | 5666037 B1 | 2/2015 | | |
| JP | 2015-063593 A | 4/2015 | | |
| JP | 2015-106027 A | 6/2015 | | |
| JP | 2015143330 A | * 8/2015 | .......... | G03F 7/0007 |
| TW | 201502705 A | 1/2015 | | |
| TW | 201634596 A | 10/2016 | | |
| WO | 2013/183426 A1 | 12/2013 | | |

OTHER PUBLICATIONS

English Translation of JP 2012-208374 A; Hideki Takakuwa; Published: Oct. 25, 2012 (Year: 2012).*
DISPERBYK-2001 Data Sheet, Published: Mar. 2014 (Year: 2014).*
ANTI-TERRA-U 100 Data Sheet, Published: Jul. 2012 (Year: 2012).*
English Translation of JP 2015-143330 A; Ken Samejima; Published: Aug. 6, 2015 (Year: 2015).*
Communication dated Dec. 18, 2020 from the Korean Intellectual Property Office in Application No. 10-2019-7022381.
Communication dated Dec. 22, 2020 from the Japanese Patent Office in Application No. 2019-507440.
International Search Report dated May 22, 2018 from the International Searching Authority in counterpart International Application No. PCT/JP2018/005367.

(Continued)

Primary Examiner — Duane Smith
Assistant Examiner — Richard Champion
(74) Attorney, Agent, or Firm — Sughrue Mion, PLLC

(57) ABSTRACT

A photosensitive coloring composition includes a magenta pigment having an average primary particle diameter of 50 nm or less, a polymerizable compound, a photopolymerization initiator, and an ultraviolet absorber, in which the magenta pigment has a maximum absorption wavelength in a range of 500 to 600 nm, and in a case where an absorbance of the maximum absorption wavelength is 1, a wavelength at which an absorbance is 0.5 is 450 nm or more on a side where a wavelength is shorter than the maximum absorption wavelength and is 650 nm or less on a side where a wavelength is longer than the maximum absorption wavelength.

20 Claims, No Drawings

(56) References Cited

OTHER PUBLICATIONS

International Preliminary Report on Patentability dated Sep. 24, 2019 from the International Bureau in counterpart International Application No. PCT/JP2018/005367.
Written Opinion dated May 22, 2018 from the International Bureau in counterpart International Application No. PCT/JP2018/005367.
Notice of Reasons for Refusal dated Jun. 9, 2020, from the Japanese Patent Office in Application No. 2019-507440.
Notice of Reasons for Refusal dated Jun. 11, 2020, from the Korean Intellectual Property Office in Korean Application No. 10-2019-7022381.
Office Action dated Mar. 18, 2021 from the Taiwanese Intellectual Property Office in TW Application No. 107106523.
Communication dated Oct. 26, 2021 from the Taiwanese Intellectual Property Office in TW application No. 107106523.

* cited by examiner

PHOTOSENSITIVE COLORING COMPOSITION, CURED FILM, COLOR FILTER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2018/005367, filed on Feb. 16, 2018, which claims priority under 35 U.S.C. § 119(a) to Japanese Patent Application No. 2017-059846, filed on Mar. 24, 2017 and Japanese Patent Application No. 2018-017285, filed on Feb. 2, 2018. Each of the above application(s) is hereby expressly incorporated by reference, in its entirety, into the present application.

BACKGROUND OF THE INVENTION

1. Field of the Invention

The present invention relates to a photosensitive coloring composition. The present invention further relates to a cured film, a color filter, a solid-state imaging element, and an image display device, each of which uses the photosensitive coloring composition.

2. Description of the Related Art

In recent years, as a digital camera, a mobile phone with a camera, and the like have been further spreading, there has been a greatly increasing demand for a solid-state imaging element such as a charge coupled device (CCD) image sensor. A color filter has been used as a key device in a display or an optical element.

A color filter has been produced using a coloring composition including a chromatic color pigment, a polymerizable compound, and a photopolymerization initiator (for example, see JP2015-106027A). In addition, a magenta color filter including Color Index Pigment Red 122 as a magenta pigment is described in JP2006-098684A.

In JP2013-254047A, it is described that a transparent pixel for a color filter is formed by using a radiation sensitive composition which includes a predetermined polymer, a polymerizable compound including an acid group and a bi- or higher (meth)acrylate compound, a polymerization initiator, an ultraviolet absorber, a solvent, an adhesion enhancing agent, a polymerization inhibitor, and a surfactant. In paragraph No. 0171 of JP2013-254047A, it is described that the radiation sensitive composition described in JP2013-254047A preferably does not contain a colorant.

SUMMARY OF THE INVENTION

In a color filter, refining of a pattern size is being progressed. By reducing an average primary particle diameter of a pigment to be used, linearity of the pattern is improved. However, developability is reduced due to the refining of the pigment and therefore a development residue between the patterns tends to easily generate. In particular, since a magenta pigment has high transparency to light used for exposure such as i-rays, in a case where a photosensitive coloring composition including the magenta pigment, a polymerizable compound, and a photopolymerization initiator is exposed through a mask, an unexposed portion of the mask circumference is easily exposed by reflected light or scattered light from a support or the like and the development residue tends to easily generate. As a result, in a photosensitive coloring composition, further improvements in photolithographic properties are desired.

In addition, according to the studies conducted by the present inventors regarding the coloring photosensitive composition including the magenta pigment, it was found that a mixed color between adjacent pixels of other hues tends to easily occur in a case of forming a pattern (pixel) by photolithography using the photosensitive coloring composition.

Therefore, an object of the present invention is to provide a photosensitive coloring composition which has excellent photolithographic properties and is capable of suppressing an occurrence of mixed color between adjacent pixels of other hues. The object of the present invention is also to provide a cured film, a color filter, a solid-state imaging element, and an image display device, each of which uses the photosensitive coloring composition.

According to the studies conducted by the present inventors, it was found that the above object can be achieved by using a photosensitive coloring composition as described later, thereby leading to completion of the present invention. The present invention provides the following aspects.

<1> A photosensitive coloring composition comprising:
a magenta pigment having an average primary particle diameter of 50 nm or less; a polymerizable compound;
a photopolymerization initiator; and
an ultraviolet absorber,
in which the magenta pigment has a maximum absorption wavelength in a range of 500 to 600 nm, and
in a case where an absorbance of the maximum absorption wavelength is 1, a wavelength at which an absorbance is 0.5 is 450 nm or more on a side where a wavelength is shorter than the maximum absorption wavelength, and is 650 nm or less on a side where the wavelength is longer than the maximum absorption wavelength.

<2> The photosensitive coloring composition according to <1>, in which the magenta pigment is a compound having a coloring agent skeleton selected from a quinacridone skeleton and a dioxazine skeleton.

<3> The photosensitive coloring composition according to <1> or <2>,
in which, in the case where the absorbance of the maximum absorption wavelength is 1, the magenta pigment has a difference of 130 nm or less between the wavelengths at which the absorbance is 0.5 on the side where the wavelength is longer than the maximum absorption wavelength and on the side where the wavelength is shorter than the maximum absorption wavelength.

<4> The photosensitive coloring composition according to any one of <1> to <3>, in which a content of the ultraviolet absorber is 1% to 20% by mass with respect to the total solid content of the photosensitive coloring composition.

<5> The photosensitive coloring composition according to any one of <1> to <4>, in which the photosensitive coloring composition contains 10 to 500 parts by mass of the ultraviolet absorber with respect to 100 parts by mass of the photopolymerization initiator.

<6> The photosensitive coloring composition according to any one of <1> to <5>,
in which the photosensitive coloring composition contains 1 to 40 parts by mass of the ultraviolet absorber with respect to 100 parts by mass of the magenta pigment.

<7> The photosensitive coloring composition according to any one of <1> to <6>, further comprising a resin having an amine value.

<8> The photosensitive coloring composition according to <7>,
in which the resin having an amine value is a resin having a nitrogen atom in a main chain.

<9> The photosensitive coloring composition according to <7> or <8>, in which the resin having an amine value is a resin having an acid value and an amine value, and
the acid value is 30 mgKOH/g or more.

<10> The photosensitive coloring composition according to any one of <1> to <7>, further comprising a resin having an acid value of 50 mgKOH/g or more.

<11> The photosensitive coloring composition according to any one of <1> to <7>, further comprising a resin having an acid value of 80 mgKOH/g or more.

<12> The photosensitive coloring composition according to any one of <1> to <11>, further comprising an alkali-soluble resin having a polymerizable group.

<13> The photosensitive coloring composition according to any one of <1> to <12>, in which the magenta pigment is at least one pigment selected from Color Index Pigment Red 122, Color Index Pigment Red 202, Color Index Pigment Red 209, Color Index Pigment Red 269, Color Index Pigment Violet 19, or Color Index Pigment Violet 23.

<14> The photosensitive coloring composition according to any one of <1> to <13>, which is used for forming a magenta coloring pixel in a color filter.

<15> A cured film obtained from the photosensitive coloring composition as described in any one of <1> to <14>.

<16> A color filter comprising the cured film as described in <15>.

<17> A color filter comprising a magenta coloring pixel obtained from the photosensitive coloring composition according to any one of <1> to <14>, a cyan coloring pixel, and a yellow coloring pixel.

<18> A solid-state imaging element comprising the color filter as described in <16> or <17>.

<19> An image display device comprising the color filter as described in <16> or <17>.

According to the present invention, it is possible to provide a photosensitive coloring composition which has excellent photolithographic properties and is capable of suppressing the occurrence of mixed color between adjacent pixels of other hues. It is also possible to provide a cured film, a color filter, a solid-state imaging element, and an image display device, each of which uses the photosensitive coloring composition.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright line spectrum of a mercury lamp, far ultraviolet rays typified by an excimer laser, extreme ultraviolet rays (EUV light), X-rays, electron beams, or the like.

In the present specification, a numerical range expressed using "to" means a range that includes the preceding and succeeding numerical values of "to" as the lower limit value and the upper limit value, respectively.

In the present specification, the total solid content refers to a total amount of the components other than a solvent from all the components of a composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, a term "step" not only means an independent step, but also includes a step which is not clearly distinguished from other steps in a case where an intended action of the step is obtained.

In the present specification, a weight-average molecular weight (Mw) and a number-average molecular weight (Mn) are each defined as a value in terms of polystyrene through measurement by means of gel permeation chromatography (GPC).

<Photosensitive Coloring Composition>

A photosensitive coloring composition of an embodiment of the present invention (hereinafter also referred to as a coloring composition) includes a magenta pigment having an average primary particle diameter of 50 nm or less, a polymerizable compound, a photopolymerization initiator, and an ultraviolet absorber, in which the magenta pigment has a maximum absorption wavelength in a range of 500 to 600 nm, and in a case where an absorbance of the maximum absorption wavelength is 1, a wavelength at which an absorbance is 0.5 is 450 nm or more on a side where the wavelength is shorter than the maximum absorption wavelength, and is 650 nm or less on a side where the wavelength is longer than the maximum absorption wavelength.

The magenta pigment included in the coloring composition of an embodiment of the present invention has the average primary particle diameter of 50 nm or less. Therefore the magenta pigment can form a pattern excellent in linearity. In addition, as described above, since the magenta pigment has high transparency to light used for exposure such as i-rays, in the related art, in a case where a coloring composition including the magenta pigment, a polymerizable compound, and a photopolymerization initiator is exposed through a mask, an unexposed portion of the mask circumference is easily exposed by reflected light or scattered light from a support or the like and the development residue between patterns tends to easily generate. However, since the coloring composition of the embodiment of the present invention further includes the ultraviolet absorber, the reflected light or the scattered light in the unexposed portion of the mask circumference can be absorbed, and as a result, the generation of the development residue can be effectively suppressed. Accordingly, the coloring composition of the embodiment of the present invention has excellent photolithographic properties.

In addition, since the coloring composition of the embodiment of the present invention can suppress the generation of the development residue between the patterns as described above, in a case where a pixel of other hues is formed next to a pixel (pattern) formed by using the coloring composition of the embodiment of the present invention, mixed color between the pixel formed by using the coloring composition of the embodiment of the present invention and the pixel of other hues can be suppressed. In addition, since a pixel formed by using the coloring composition including the magenta pigment has high transparency to the light used for the exposure such as i-rays, in the related art, a development residue of other coloring pixels occurs on the pixel (hereinafter also referred to as magenta coloring pixel) formed by using the coloring composition including the magenta pigment and the magenta coloring pixel is mixed with the development residue of the other coloring pixels. However, since the coloring composition of the embodiment of the present invention includes the ultraviolet absorber, the pixel itself formed by using the coloring composition of the embodiment of the present invention also has low transparency to the light used for the exposure such as i-rays. As a result, the development residue of the other coloring pixels hardly occurs on the pixel formed by using the coloring composition of the embodiment of the present invention and the pixel formed by using the coloring composition of the embodiment of the present invention can be suppressed from mixing color with the other coloring pixels.

The coloring composition of the embodiment of the present invention can also form a cured film excellent in light resistance. The reason is presumed that the coloring composition of the embodiment of the present invention has low transparency to ultraviolet rays including i-rays so that the energy given to the cured film at light irradiation is low.

The coloring composition of the embodiment of the present invention can be preferably used as a coloring composition for forming the magenta coloring pixel in a color filter.

The coloring composition of the embodiment of the present invention preferably has a maximum absorption wavelength in a range of 500 to 600 nm. In addition, in the coloring composition of the embodiment of the present invention, in a case where an absorbance of the maximum absorption wavelength in the range of 500 to 600 nm is 1, a wavelength at which an absorbance is 0.5 is preferably 450 nm or more, more preferably 460 nm or more, and still more preferably 470 nm or more on a side where the wavelength is shorter than the maximum absorption wavelength. In addition, in the case where the absorbance of the maximum absorption wavelength in the range of 500 to 600 nm is 1, the wavelength at which the absorbance is 0.5 is preferably 650 nm or less, more preferably 640 nm or less, still more preferably 630 nm or less, and particularly preferably 620 nm or less on a side where the wavelength is longer than the maximum absorption wavelength. Hereinafter, in the case where the absorbance of the maximum absorption wavelength is 1, the wavelength at which the absorbance is 0.5 on the side where the wavelength is shorter than the maximum absorption wavelength also refers to as wavelength $\lambda 1$. In addition, in the case where the absorbance of the maximum absorption wavelength is 1, the wavelength at which the absorbance is 0.5 on the side where the wavelength is longer than the maximum absorption wavelength also refers to as wavelength $\lambda 2$.

In addition, a difference between the maximum absorption wavelength and the wavelength $\lambda 1$ is preferably 110 nm or less, more preferably 100 nm or less, and still more preferably 90 nm or less. In addition, a difference between the wavelength $\lambda 2$ and the maximum absorption wavelength is preferably 110 nm or less, more preferably 100 nm or less, and still more preferably 90 nm or less. In addition, in the coloring composition of the embodiment of the present invention, a difference between the wavelength $\lambda 2$ and the wavelength $\lambda 1$ ($\lambda 2-\lambda 1$) is preferably 130 nm or less, more preferably 120 nm or less, still more preferably 115 nm or less, and particularly preferably 110 nm or less. A coloring composition having such spectral characteristics is preferably used for forming the magenta coloring pixel. Hereinafter, the respective components used for the coloring composition of the embodiment of the present invention will be described.

<<Magenta Pigment>>

The coloring composition of the embodiment of the present invention includes a magenta pigment having a maximum absorption wavelength in a range of 500 to 600 nm. The maximum absorption wavelength of the magenta pigment can be measured by a method of forming a film by using a composition including the magenta pigment and a resin to measure spectral characteristics of the film by using a spectrophotometer, or a method of preparing a dispersion liquid containing only the magenta pigment to measure spectral characteristics of the pigment dispersion liquid by using the spectrophotometer.

The maximum absorption wavelength of the magenta pigment is preferably in a range of 500 to 590 nm, more preferably in a range of 500 to 585 nm, and still more preferably in a range of 500 to 580 nm.

In addition, in the magenta pigment used in the present invention, in a case where an absorbance of the maximum absorption wavelength in a range of 500 to 600 nm is 1, a wavelength at which an absorbance is 0.5 is 450 nm or more, preferably 460 nm or more, and more preferably 470 nm or more on the side where the wavelength is shorter than the maximum absorption wavelength. In addition, in the magenta pigment used in the present invention, in the case where an absorbance of the maximum absorption wavelength in the range of 500 to 600 nm is 1, a wavelength at which the absorbance is 0.5 is 650 nm or less, preferably 640 nm or less, more preferably 630 nm or less, and still more preferably 620 nm or less on the side where the wavelength is longer than the maximum absorption wavelength. In addition, in the magenta pigment used in the present invention, a difference between the maximum absorption wavelength and the wavelength $\lambda 1$ is preferably 110 nm or less, more preferably 100 nm or less, and still more preferably 90 nm or less. In addition, a difference between the wavelength $\lambda 2$ and the maximum absorption wavelength is preferably 110 nm or less, more preferably 100 nm or less, and still more preferably 90 nm or less. In addition, in the magenta pigment used in the present invention, a difference between the wavelength $\lambda 2$ and the wavelength $\lambda 1$ ($\lambda 2-\lambda 1$) is preferably 130 nm or less, more preferably 120 nm or less, still more preferably 115 nm or less, and particularly preferably 110 nm or less.

The magenta pigment used in the present invention is preferably a compound having a coloring agent skeleton selected from a quinacridone skeleton, a dioxazine skeleton, and a naphthol azo skeleton, more preferably a compound having a coloring agent skeleton selected from the quinacridone skeleton and the dioxazine skeleton, and still more preferably a compound having the quinacridone skeleton as a coloring agent skeleton for a reason of spectral performance and stability.

Specific examples of the magenta pigment used in the present invention include Color Index (C. I.) Pigment Red 122, C. I. Pigment Red 202, C. I. Pigment Red 209, C. I. Pigment Red 269, C. I. Pigment Violet 19, and C. I. Pigment Violet 23. Among these, C. I. Pigment Red 122, C. I. Pigment Red 202, C. I. Pigment Red 209, and C. I. Pigment Violet 19 are compounds having the quinacridone skeleton, C. I. Pigment Violet 23 is a compound having the dioxazine skeleton, and C. I. Pigment Red 269 is a compound having the naphthol azo skeleton.

An average primary particle diameter of the magenta pigment used in the present invention is 50 nm or less, preferably 47 nm or less, and still more preferably 45 nm or less. The lower limit is not particularly limited, but is preferably 20 nm or more. In a case where the average primary particle diameter of the magenta pigment is 50 nm or less, a refined pattern excellent in linearity can be formed. In addition, in the related art, in a case of using a small average primary particle diameter of the magenta pigment, developability is reduced and therefore the development residue between patterns tends to easily generate. However, according to the present invention, the generation of the development residue between patterns can be effectively suppressed even though the average primary particle diameter of the magenta pigment is small. Therefore, the effect of the present invention is remarkable in a case of using a magenta pigment having a smaller average primary particle diameter. Furthermore, in the present specification, an average primary particle diameter of a pigment refers to a number-average particle diameter determined from an image obtained by observing the pigment by using a transmission electron microscope (for example, a device in accordance with a field emission type transmission electron microscope manufactured by JEOL Ltd., JEM-2100F Type). Specifically, a projected area of the pigment is determined by the above-mentioned device, an equivalent circle diameter of each pigment is determined therefrom, and then the average primary particle diameter is calculated. More specifically, equivalent circle diameters of 100 pigments are measured, and then equivalent circle diameters are arithmetically averaged for 80 pigments excluding 10 pigments from the largest size and 10 pigments from the smallest size among the 100 pigments to calculate the average primary particle diameter of the pigment.

The magenta pigment having the average primary particle diameter of 50 nm or less may be a commercially available product or a magenta pigment which has an average primary particle diameter of more than 50 nm and is subjected to a refining treatment. The refining treatment method of the magenta pigment is not particularly limited and can be performed using a known method in the related art. Examples of the refining treatment method include various milling methods such as a beads mill method or a salt milling method, and the salt milling method is preferable for a reason that primary particles can be efficiently refined.

The refining treatment in the salt milling method is preferably performed by kneading the magenta pigment in the presence of a water-soluble organic solvent and a water-soluble inorganic salt. A blending amount of the water-soluble inorganic salt is preferably 100 to 2,000 parts by mass and more preferably 500 to 2,000 parts by mass with respect to 100 parts by mass of the magenta pigment. Examples of the water-soluble organic solvent include alkylene glycol such as ethylene glycol and propylene glycol, a condensate of alkylene glycol such as diethylene glycol, triethylene glycol, dipropylene glycol, polyethylene glycol and polyethylene-propylene glycol, alkyl ether of (poly)alkylene glycol such as methoxy ethanol and polyethylene glycol monomethyl ether, and glycerin. Examples of the water-soluble inorganic salt include sodium chloride, potassium chloride, calcium chloride, sodium sulfate, aluminum sulfate, and sodium hydrogen carbonate. A kneading machine is not particularly limited as long as the machine has a function capable of kneading the above-mentioned mixture. For example, a double-arm type kneader, a flasher, a planetary mixer, or the like can be used. The double-arm type kneader having a strong shearing force for the refining is more preferable.

The temperature (milling temperature) at which the above-mentioned mixture is kneaded is preferably 30° C. to 150° C. and more preferably 80° C. to 100° C. In addition, the time (milling time) when the above-mentioned mixture is kneaded is preferably 5 to 20 hours and more preferably 8 to 18 hours.

After kneading the mixture, the water-soluble organic solvent and the water-soluble inorganic salt are removed from the mixture. As necessary, a refined magenta pigment can be obtained by performing a washing, a filtration, a drying, a pulverization, or the like.

In the coloring composition of the embodiment of the present invention, a content of the magenta pigment is preferably 20% to 80% by mass with respect to the total solid content of the coloring composition. The upper limit is preferably 75% by mass or less and more preferably 70% by mass or less. The lower limit is preferably 25% by mass or more and more preferably 30% by mass or more. The magenta pigment may be of one kind or two or more kinds thereof. In a case where two or more kinds of the magenta pigments are included, the total amount thereof is preferably within the above-mentioned range.

<<Other Colorants>>

The coloring composition of the embodiment of the present invention can further use a colorant (other colorants) other than the magenta pigment. Other colorants may be either a dye or a pigment, or used in combination thereof. Examples of the pigment include various inorganic pigments or organic pigments known in the related art. In addition, in consideration of either the inorganic pigment or organic pigment preferably having high transmittance, it is preferable that a pigment having an average particle diameter as small as possible is used. Furthermore, in consideration of handleability, the average primary particle diameter of the above-mentioned pigment is preferably 0.01 to 0.1 μm and more preferably 0.01 to 0.05 μm.

Examples of the inorganic pigment include metal compounds such as a metal oxide and a metal complex salt. In addition, examples of the inorganic pigment include black pigments such as carbon black and titanium black, oxides of metals such as iron, cobalt, aluminum, cadmium, lead, copper, titanium, magnesium, chromium, zinc, and antimony, and multiple oxides of the above-mentioned metals.

Examples of the organic pigment include the following organic pigments.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 147, 148, 150, 151, 152, 153, 154, 155, 156, 161, 162, 164, 166, 167, 168, 169, 170, 171, 172, 173, 174, 175, 176, 177, 179, 180, 181, 182, 187, 188, 193, 194, 199, 213, 214

C. I. Pigment Green 7, 10, 36, 37

C. I. Pigment Orange 2, 5, 13, 16, 17:1, 31, 34, 36, 38, 43, 46, 48, 49, 51, 52, 55, 59, 60, 61, 62, 64, 71, 73

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 123, 144, 146, 149, 150, 155, 166, 168, 169, 170, 171, 172, 175, 176, 177, 178, 179, 184, 185, 187, 188, 190, 200, 206, 207, 208, 210, 216, 220, 224, 226, 242, 246, 254, 255, 264, 270, 272, 279

C. I. Pigment Violet 1, 27, 32, 37, 42

C. I. Pigment Blue 1, 2, 15, 15:1, 15:2, 15:3, 15:4, 15:6, 16, 22, 60, 64, 66, 79, 80

In addition, an aluminum phthalocyanine compound having a phosphorus atom can also be used as the blue pigment. Specific examples thereof include the compounds described in paragraph Nos. 0022 to 0030 of JP2012-247591A and paragraphs 0047 of JP2011-157478A.

As the dye, for example, a coloring agent disclosed in JP1989-090403A (JP-564-090403A), JP1989-091102A (JP-564-091102A), JP1989-094301A (JP-H01-094301A), JP1994-011614A (JP-H06-011614A), JP2592207B, U.S. Pat. Nos. 4,808,501A, 5,667,920A, JP1993-333207A (JP-H05-333207A), JP1994-035183A (JP-H06-035183A), JP1994-051115A (JP-H06-051115A), or JP1994-194828A (JP-H06-194828A) can be used. In a case of being classified as chemical structures, pyrazolazo compound, pyrromethene compound, anilinoazo compound, triarylmethane compound, anthraquinone compound, benzylidene compound, oxonol compound, pyrazolotriazolazo compound, pyridonazo compound, cyanine compound, phenothiazine compound, pyrrolopyrazolazomethine compound, or the like can be used.

A coloring agent multimer can also be used as other colorants. The coloring agent multimer is preferably a dye that is used after being dissolved in a solvent, but the coloring agent multimer may form a particle. In a case where the coloring agent multimer forms a particle, the coloring agent multimer is dispersed in a solvent or the like and then used. The coloring agent multimer in a particle state can be obtained by, for example, an emulsion polymerization. Examples of the coloring agent multimer in the particle state include compounds described in JP2015-214682A. In addition, as the coloring agent multimer, the compounds described in JP2011-213925A, JP2013-041097A, JP2015-028144A, JP2015-030742A, or the like can also be used.

Furthermore, as other colorants, the quinophthalone compounds described in paragraph Nos. 0011 to 0034 of JP2013-054339A, the quinophthalone compounds described in paragraphs 0013 to 0058 of JP2014-026228A, or the like can be used.

In the case of forming the magenta coloring pixel using the coloring composition of the embodiment of the present invention, it is preferable that other colorants are not substantially contained. In the present invention, the case where the coloring composition does not substantially contain other colorants means that the coloring composition does not contain other colorants or formed pixels contain other colorants only to an extent in which the formed pixels are practically recognized as magenta color. For example, the content of other colorants is preferably 10 parts by mass, more preferably 0.5 parts by mass, and still more preferably 0.1 parts by mass with respect to 100 parts by mass of the magenta pigment, and the coloring composition is even still more preferably not to contain other colorants.

In a case where the coloring composition of the embodiment of the present invention contains other colorants, the kind of other colorants may be one or two or more. In a case of including two or more kinds of other colorants, the total amount thereof is preferably within the range.

<<Polymerizable Compound>>

The coloring composition of the embodiment of the present invention contains a polymerizable compound. Known compounds which can be crosslinked by radical, acid, or heat can be used as the polymerizable compound. In the present invention, the polymerizable compound is preferably, for example, a compound having an ethylenically unsaturated bonding group. Examples of the group having an ethylenically unsaturated bonding group include a vinyl group, a (meth)allyl group, and a (meth)acryloyl group. The polymerizable compound used in the present invention is preferably a radical polymerizable compound.

Any chemical forms of a monomer, a prepolymer, an oligomer, or the like may be used as the polymerizable compound, but the monomer is preferable. A molecular weight of the polymerizable compound is preferably 100 to 3,000. The upper limit is more preferably 2,000 or less and still more preferably 1,500 or less. The lower limit is more preferably 150 or more and still more preferably 250 or more.

The polymerizable compound is preferably a compound including three or more ethylenically unsaturated bonding groups, more preferably a compound including 3 to 15 ethylenically unsaturated bonding groups, and still more preferably a compound having 3 to 6 ethylenically unsaturated bonding groups. In addition, the polymerizable compound is preferably a trifunctional to pentadecafunctional (meth)acrylate compound and more preferably a trifunctional to hexafunctional (meth)acrylate compound. Specific examples of the polymerizable compound include compounds described in paragraph Nos. 0095 to 0108 of JP2009-288705A, paragraph No. 0227 of JP2013-029760A, and paragraph Nos. 0254 to 0257 of JP2008-292970A, and the contents of which are incorporated herein by reference.

The polymerizable compound is preferably a compound such as dipentaerythritol triacrylate (as a commercially available product, KAYARAD D-330 manufactured by Nippon Kayaku Co., Ltd.); dipentaerythritol tetraacrylate (as a commercially available product, KAYARAD D-320 manufactured by Nippon Kayaku Co., Ltd.); dipentaerythritol penta(meth)acrylate (as a commercially available product, KAYARAD D-310 manufactured by Nippon Kayaku Co., Ltd.); dipentaerythritol hexa(meth)acrylate (as a commercially available product, KAYARAD DPHA manufactured by Nippon Kayaku Co., Ltd., NK ESTER A-DPH-12E, manufactured by Shin-Nakamura Chemical Co., Ltd.); and a compound having a structure in which the (meth)acryloyl group is bonded through an ethylene glycol and/or a propylene glycol residue (for example, SR454 and SR499 which are commercially available products from Sartomer). Oligomers of the above-described examples can also be used. As the polymerizable compound, NK ESTER A-TMMT (manufactured by Shin-Nakamura Chemical Co., Ltd.) and KAYARAD RP-1040 and DPCA-20 (manufactured by Nippon Kayaku Co., Ltd.) can also be used. In addition, as the polymerizable compound, it is preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd), and KAYARAD GPO-303, TMPTA, THE-330, TPA-330, and PET-30 (manufactured by Nippon Kayaku Co., Ltd.).

The polymerizable compound may have an acid group. By using a polymerizable compound having an acid group, the polymerizable compound in an unexposed portion is easily removed in development and the generation of the development residue can be suppressed. Examples of an acid group include a carboxyl group, a sulfo group, and a phosphoric acid group, and a carboxyl group is preferable. Examples of a commercially available product of the polymerizable compound having an acid group include ARONIX M-510, M-520, ARONIX TO-2349 (manufactured by TOA-GOSEI CO., LTD.).

An acid value of the polymerizable compound having an acid group is preferably 0.1 to 40 mgKOH/g and more preferably 5 to 30 mgKOH/g. In a case where an acid value of the polymerizable compound is 0.1 mgKOH/g or more, solubility in a developer is good, and in a case where an acid value of the polymerizable compound is 40 mgKOH/g or less, it is advantageous in production and handling.

A polymerizable compound having a caprolactone structure can also be used as the polymerizable compound. Examples of the polymerizable compound having the caprolactone structure include DPCA-20, DPCA-30, DPCA-60, and DPCA-120, each of which is commercially available as KAYARAD DPCA series from Nippon Kayaku Co., Ltd.

A polymerizable compound having an alkyleneoxy group can also be used as the polymerizable compound. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth)acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having four ethyleneoxy groups, and KAYARAD TPA-330 manufactured by Nippon Kayaku Co., Ltd., which is a trifunctional (meth)acrylate having three isobutyleneoxy groups.

A polymerizable compound having a fluorene skeleton can also be used as the polymerizable compound. Examples of a commercially available product of the polymerizable compound having the fluorene skeleton include OGSOL EA-0200, EA-0300 (manufactured by Osaka Gas Chemicals Co., Ltd., (meth)acrylate monomer having a fluorene skeleton), and the like.

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable compound. In addition, polymerizable compounds having an amino structure or a sulfide structure in the molecule described in JP1988-277653A (JP-S63-277653A), JP1988-260909A (JP-S63-260909A), or JP1989-105238A (JP-H01-105238A) are preferably used. Examples of a commercially available product include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600 and AI-600 (manufactured by Kyoeisha Chemical Co., Ltd.).

The content of the polymerizable compound is preferably 0.1% to 50% by mass with respect to the total solid content of the coloring composition. The lower limit is more preferably 0.5% by mass or more and still more preferably 1% by mass or more. The upper limit is more preferably 45% by mass or less and still more preferably 40% by mass or less. The polymerizable compound may be used singly or in combination of two or more kinds thereof. In a case where the polymerizable compounds are used in combination of two or more kinds thereof, the total amount thereof is preferably within the above-mentioned range.

<<Photopolymerization Initiator>>

The coloring composition of the embodiment of the present invention contains a photopolymerization initiator. The photopolymerization initiator is not particularly limited as long as having an ability to initiate a polymerization of the polymerizable compound and can be appropriately selected from known photopolymerization initiators. For example, a compound having photosensitivity to light in a range from the ultraviolet range to the visible range is preferable. In addition, the photopolymerization initiator may be a compound that produces an active radical by causing some action with a photoexcited sensitizer.

Examples of the photopolymerization initiator include halogenated hydrocarbon derivatives (for example, a compound having a triazine skeleton and a compound having an oxadiazole skeleton), an acylphosphine compound, hexaaryl biimidazole, an oxime compound, an organic peroxide, a thio compound, a ketone compound, an aromatic onium salt, an α-hydroxyketone compound, and an a-aminoketone compound. From the viewpoint of the exposure sensitivity, as the photopolymerization initiator, a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound are preferable, a compound selected from an oxime compound, the α-hydroxyketone compound, the α-aminoketone compound, and an acylphosphine compound is more preferable, and an oxime compound is still more preferable. With regard to the photopolymerization initiator, reference can be made to the description in paragraphs 0065 to 0111 of JP2014-130173A, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all manufactured by BASF). Examples of a commercially available product of the α-aminoketone compound include IRGACURE-907, IRGACURE-369, IRGACURE-379, and IRGACURE-379EG (all manufactured by BASF). Examples of a commercially available product of the acylphosphine compound include IRGACURE-819 and DAROCUR-TPO (both manufactured by BASF).

As the oxime compound, for example, the compounds described in JP2001-233842A, the compounds described in JP2000-080068A, and the compounds described in JP2006-342166A can be used. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

As the oxime compound, the compounds described in J. C. S. Perkin II (1979), pp. 1653 to 1660, J. C. S. Perkin II (1979), pp. 156 to 162, Journal of Photopolymer Science and Technology (1995), pp. 202 to 232, each of the publications of JP2000-066385A, JP2000-080068A, JP2004-534797A, and JP2006-342166A, or the like can also be used. As a commercially available product of the oxime compound, IRGACURE-OXE01, IRGACURE-OXE02, IRGACURE-OXE03, and IRGACURE-OXE04 (all manufactured by BASF) are also suitably used. In addition, TRONLY TR-PBG-304, TRONLY TR-PBG-309, and TRONLY TR-PBG-305 (manufactured by CHANGZHOU TRONLY NEW ELECTRONIC MATERIALS CO., LTD.), or ADEKA ARKLS NCI-930 and ADEKA OPTOMER N-1919 (all manufactured by ADEKA Corporation, a photopolymerization initiator 2 described in JP2012-014052A) can also be used.

Moreover, as oxime compounds other than the above-described oxime compounds, the compounds described in JP2009-519904A in which oxime is linked to N of a carbazole ring, the compounds described in U.S. Pat. No. 7,626,957B in which a hetero-substituent is introduced into a benzophenone moiety, the compounds described in JP2010-015025A in which a nitro group is introduced into a coloring agent site, the compounds described in US2009-0292039A, the ketoxime compounds described in WO2009/131189A, the compounds described in U.S. Pat. No. 7,556,910B, which contains a triazine skeleton and an oxime skeleton in the same molecule, the compound described in JP2009-221114A, which has a maximum absorption at 405 nm and has good sensitivity to a light source of g-rays, and the like may be used. Preferably, reference can be made to, for example, the descriptions in paragraph Nos. 0274 to 0306 of JP2013-029760A, the contents of which are incorporated herein by reference.

In the present invention, an oxime compound having a fluorene ring can also be used as the photopolymerization initiator. Specific examples of the oxime compound having a fluorene ring include the compounds described in JP2014-137466A. The contents of the publications are incorporated herein by reference.

In the present invention, an oxime compound having a benzofuran skeleton can also be used as the photopolymerization initiator. Specific examples thereof include the compounds OE-01 to OE-75 described in WO2015/036910A.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A. The contents of the publications are incorporated herein by reference.

In the present invention, an oxime compound having a nitro group can also be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

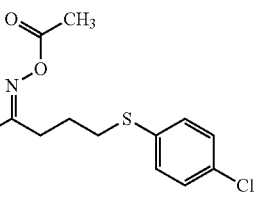
(C-1)

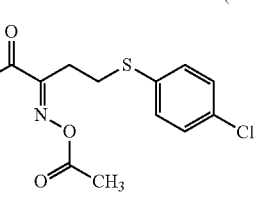
(C-2)

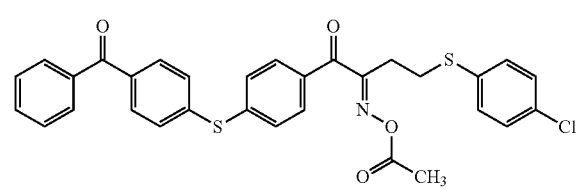
(C-3)

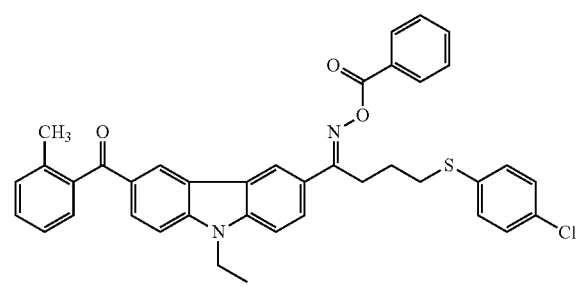
(C-4)

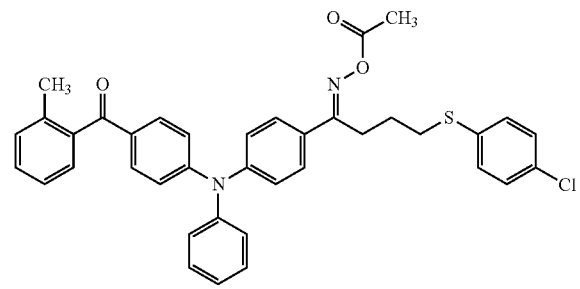
(C-5)

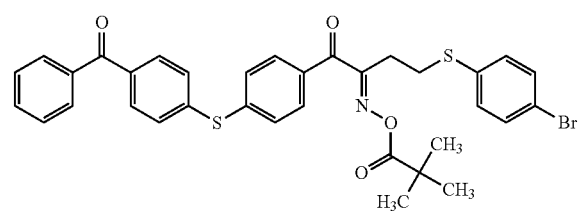
(C-6)

(C-7)
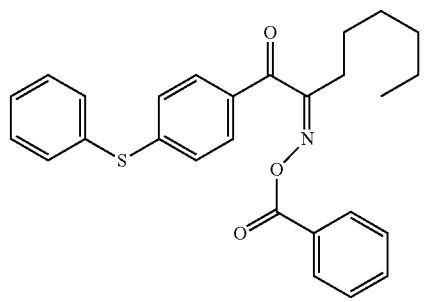

(C-8)
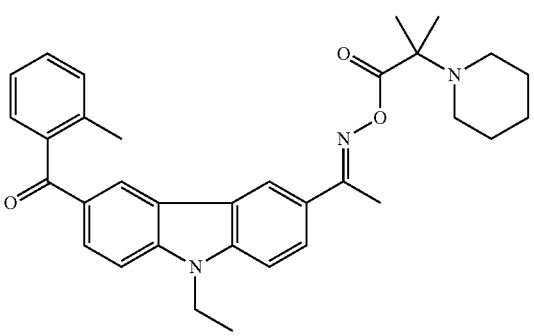

(C-9)

(C-10)
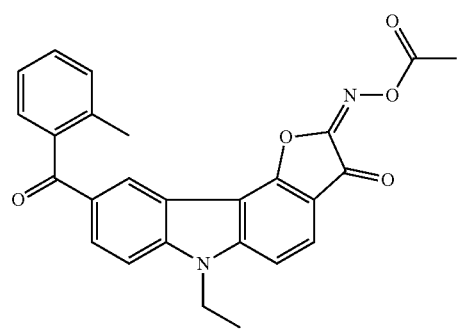

(C-11)

(C-12)
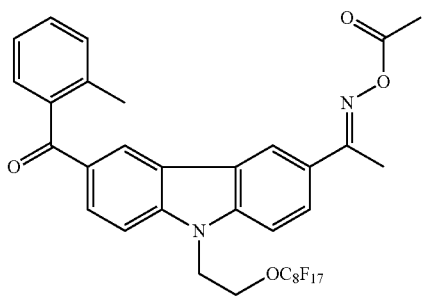

(C-13)
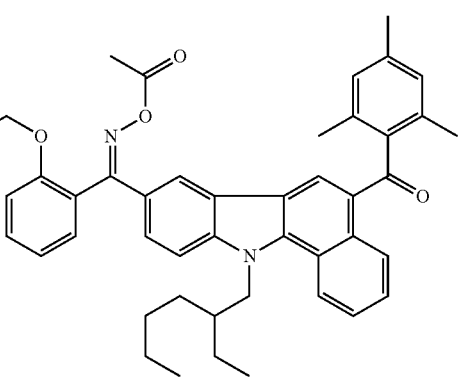

(C-14)
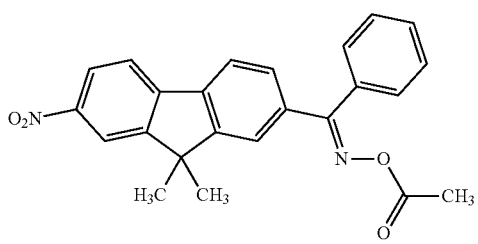

As the oxime compound, the compound having a maximum absorption wavelength in a range of 350 to 500 nm is preferable, the compound having a maximum absorption wavelength in a range of 360 nm to 480 nm is more preferable. The oxime compound is particularly preferably a compound showing a high absorbance at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, but specifically, it is preferably measured, for example, by means of an ultraviolet and visible light spectrophotometer (Cary-5 spectrophotometer manufactured by Varian) at a concentration of 0.01 g/L using an ethyl acetate solvent.

The content of the photopolymerization initiator is preferably 0.1% to 50% by mass, more preferably 0.5% to 30% by mass, and still more preferably 1% to 20% by mass, with respect to the total solid content of the coloring composition. In a case where the content of the photopolymerization initiator is within the range, good sensitivity and good pattern forming properties are obtained. The coloring composition of the embodiment of the present invention may include only one kind or two or more kinds of the photopolymerization initiators. In a case of including two or more kinds of the photopolymerization initiators, the total amount thereof is preferably within the above-mentioned range.

<<Ultraviolet Absorber>>

The coloring composition of the embodiment of the present invention contains an ultraviolet absorber. The ultraviolet absorber is preferably a compound having a maximum absorption wavelength in a range of 300 to 400 nm and more preferably a compound having a maximum absorption wavelength in a range of 320 to 380 nm. By using the compounds, the generation of the development residue between the patterns can be effectively suppressed. In addition, it is possible to form a pattern excellent in rectangularity or linearity. Furthermore, it is possible to effectively suppress the occurrence of mixed color between adjacent pixels of other hues.

In the present invention, the molar light absorption coefficient at 365 nm of the ultraviolet absorber is preferably 5,000 $L \times mol^{-1} \times cm^{-1}$ or more, more preferably 10,000 $L \times mol^{-1} \times cm^{-1}$ or more, and still more preferably 30,000 $L \times mol^{-1} \times cm^{-1}$ or more. The upper limit is preferably, for example, 100,000 $L \times mol^{-1} \times cm^{-1}$ or less. By using the compounds, the generation of the development residue between the patterns can be more effectively suppressed. Furthermore, it is possible to more effectively suppress the occurrence of mixed color between adjacent pixels of other hues.

As the ultraviolet absorber, a conjugated diene compound, a methyldiebenzoyl compound, a coumarin compound, a salicylate compound, a benzophenone compound, a benzotriazole compound, an acrylonitrile compound, a triazine compound, a benzodithiazole compound, or the like can be used. Among those, for the reason of having high molar light absorption coefficient at 365 nm, a conjugated diene compound, a methyldiebenzoyl compound, a benzotriazole compound, a triazine compound, a benzophenone compound, or a benzodithiazole compound is preferable, a conjugated diene compound, a methyldiebenzoyl compound, or a triazine compound is more preferable, a conjugated diene compound or a methyldiebenzoyl compound is still more preferable, and a conjugated diene compound is particularly preferable. In addition, since the conjugated diene compound has high light-shielding of i-rays and further has a function as a polymerization inhibitor, the effects tend to be obtained more remarkably.

As the conjugated diene compound, a compound represented by Formula (UV-1) is preferable.

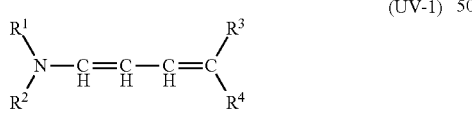
(UV-1)

In Formula (UV-1), $R^1$ and $R^2$ each independently represent a hydrogen atom, an alkyl group having 1 to 20 carbon atoms, or an aryl group having 6 to 20 carbon atoms, and $R^1$ and $R^2$ may be the same as or different from each other, but are not simultaneously a hydrogen atom.

$R^1$ and $R^2$ may form a cyclic amino group with a nitrogen atom to which $R^1$ and $R^2$ are bonded. Examples of the cyclic amino group include a piperidino group, a morpholino group, a pyrrolidino group, a hexahydroazepino group and a piperazino group.

$R^1$ and $R^2$ each independently preferably represent an alkyl group having 1 to 20 carbon atoms, more preferably represent an alkyl group having 1 to 10 carbon atoms, and still more preferably represent an alkyl group having 1 to 5 carbon atoms.

$R^3$ and $R^4$ represent an electron withdrawing group. $R^3$ and $R^4$ are preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group. In addition, $R^3$ and $R^4$ may be bonded to each other to form a cyclic electron withdrawing group. An example of the cyclic electron withdrawing group formed by $R^3$ and $R^4$ being bonded to each other includes a six-membered ring including 2 carbonyl groups.

At least one of the $R^1$, $R^2$, $R^3$, or $R^4$ may be a polymer form derived from a monomer bonded with a vinyl group through a linking group. The polymer may be a copolymer of another monomer.

With regard to the explanation of a substituent of the ultraviolet absorber represented by Formula (UV-1), reference can be made to the description in paragraph Nos. 0024 to 0033 of WO2009/123109 (paragraph Nos. <0040> to <0059> of the corresponding US2011/0039195A), and the contents thereof are incorporated herein by reference. Specific examples of the ultraviolet absorber represented by Formula (UV-1) include the following compounds. In addition, with regard to the preferred specific examples of the compounds represented by Formula (UV-1), reference can be made to the description in paragraph Nos. 0034 to 0037 of WO2009/123109 (paragraph No. <0060> of the corresponding US2011/0039195A) which describes example compounds (1) to (14), and the contents thereof are incorporated herein by reference. Examples of a commercially available product of the ultraviolet absorber represented by Formula (UV-1) include UV503 (manufactured by Daito Chemical Co., Ltd.) or the like.

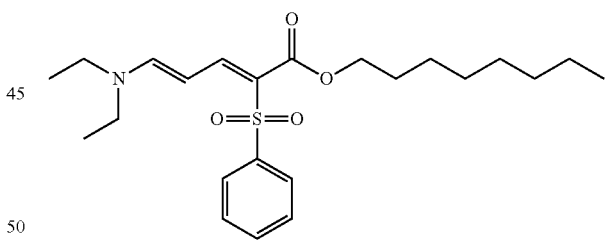

As a methyl dibenzoyl compound, compounds represented by the Formula (UV-2) are preferable.

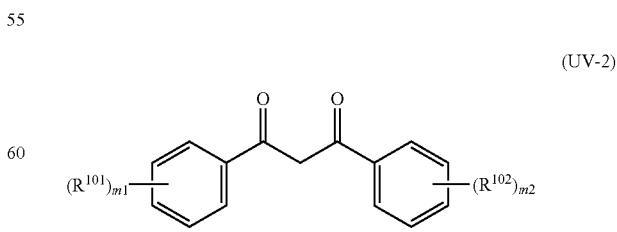
(UV-2)

In Formula (UV-2), $R^{101}$ and $R^{102}$ each independently represent a substituent, and m1 and m2 each independently represent an integer of 0 to 5.

Examples of the substituent represented by $R^{101}$ and $R^{102}$ include a halogen atom, a cyano group, a nitro group, an alkyl group, an aryl group, a heteroaryl group, an alkoxy group, an aryloxy group, a heteroaryloxy group, an alkylthio group, an arylthio group, a heteroarylthio group, —$NR^{U1}$—$R^{U2}$, —$COR^{U3}$, —$COOR^{U4}$, —$OCOR^U$, —$NHCOR^{U6}$, —$CONR^{U7}R^{U8}$, —$NHCONR^{U9}R^{U10}$, —$NHCOOR^{U11}$, —$SO_2R^{U12}$, —$SO_2OR^{U13}$, —$NHSO_2RU^{14}$ or —$SO_2NR^{U15}R^{U16}$. $R^{U1}$ to $R^{U16}$ each independently represent a hydrogen atom, an alkyl group or an aryl group having 1 to 8 carbon atoms.

Each of substituents represented by $R^{101}$ and $R^{102}$ is independently preferably an alkyl group or an alkoxy group. The alkyl group preferably has 1 to 20 carbon atoms and more preferably has 1 to 10 carbon atoms. The alkyl group may be any of linear, branched, or cyclic forms, and is preferably linear or branched and more preferably branched. The alkoxy group preferably has 1 to 20 carbon atoms and more preferably has 1 to 10 carbon atoms. The alkoxy group is preferably linear or branched and more preferably branched.

In Formula (UV-2), a combination in which one of the $R^{101}$ or $R^{102}$ is an alkyl group and the other is an alkoxy group is preferable.

m1 and m2 each independently represent an integer of 0 to 5. Each of m1 and m2 is independently preferably 0 to 2, more preferably 0 to 1, and particularly preferably 1.

Specific example of the compound represented by Formula (UV-2) includes avobenzone.

Examples of benzotriazole compound include 2-(2'-hydroxy-3',5'-di-tert-butylphenyl)-5-chloro-benzotriazole, 2-(2'-hydroxy-3'-tert butyl-5'-methylphenyl)-5-chloro-benzotriazole, 2-(2'-hydroxy-3'-tert-amyl-5'-isobutylphenyl)-5-chloro-benzotriazole, 2-(2'-hydroxy-3'-isobutyl-5'-methylphenyl)-5-chloro-benzotriazole, 2-(2'-hydroxy-3'-isobutyl-5'-propylphenyl)-5-chloro-benzotriazole, 2-(2'-hydroxy-3',5'-di-tert-butylphenyl)benzotriazole, 2-(2'-hydroxy-5'-methylphenyl) benzotriazole, 2-[2'-hydroxy-5'-(1,1,3,3-tetramethyl)phenyl] benzotriazole, 2-(2-hydroxy-5-tert-butylphenyl)-2H-benzotriazole, 3-(2H-benzotriazol-2-yl)-5-(1,1-dimethylethyl)-4-hydroxy, 2-(2H-benzotriazol-2-yl)-4,6-bis(1-methyl-1-phenylethyl)phenol, or 2-(2H-benzotriazol-2-yl)-6-(1-methyl-1-phenylethyl)-4-(1,1,3,3-tetramethylbutyl)phenol. Examples of a commercially available product include TINUVIN PS, TINUVIN 99-2, TINUVIN 109, TINUVIN 328, TINUVIN 384-2, TINUVIN 900, TINUVIN 928, TINUVIN 171, or TINUVIN 1130 (all manufactured by BASF). As the benzotriazole compound, MYUA series manufactured by Miyoshi Oil & Fat Co., Ltd. (The Chemical Daily, Feb. 1, 2016) may be used.

Examples of the triazine compound include TINUVIN 1577FF, TINUVIN 400, or TINUVIN 411L (all manufactured by BASF).

Examples of the benzophenone compound include Uvinul A, Uvinul 3049, or Uvinul 3050 (all manufactured by BASF).

Examples of the coumarin compound include coumarin-4, 4-hydroxycoumarin, or 7-hydroxycoumarin.

The content of the ultraviolet absorber of the coloring composition of the embodiment of the present invention is preferably 0.1% to 20% by mass with respect to the total solid content of the coloring composition. The upper limit is preferably 15% by mass or less, more preferably 10% by mass or less, and still more preferably 5% by mass or less. The lower limit is preferably 0.2% by mass or more, more preferably 0.5% by mass or more, and still more preferably 1% by mass or more. In a case where the content of the ultraviolet absorber is within the range, the generation of the development residue between patterns or the occurrence of mixed color between adjacent pixels of other hues can be effectively suppressed without impairing the pattern shape.

In addition, the content of the ultraviolet absorber is preferably 10 to 500 parts by mass with respect to 100 parts by mass of the photopolymerization initiator. The upper limit is preferably 450 parts by mass or less, more preferably 300 parts by mass or less, and still more preferably 200 parts by mass or less. The lower limit is preferably 15 parts by mass or more, more preferably 20 parts by mass or more, and still more preferably 25 parts by mass or more. In a case where the content of the ultraviolet absorber is within the range, the generation of the development residue between patterns or the occurrence of mixed color between adjacent pixels of other hues can be effectively suppressed.

In addition, the content of the ultraviolet absorber is preferably 1 to 40 parts by mass with respect to 100 parts by mass of the magenta pigment. The upper limit is preferably 35 parts by mass or less, more preferably 30 parts by mass or less, and still more preferably 25 parts by mass or less. The lower limit is preferably 1.1 parts by mass or more, more preferably 1.5 parts by mass or more, and still more preferably 2 parts by mass or more. In a case where the content of the ultraviolet absorber is within the range, the generation of the development residue between patterns or the occurrence of mixed color between adjacent pixels of other hues can be effectively suppressed.

<<Resin>>

The coloring composition of the embodiment of the present invention can include a resin. The resin is blended in, for example, an application for dispersing a pigment in the composition or an application as a binder. Incidentally, a resin which is used for dispersing a pigment in a composition is also referred to as a dispersant. However, such uses of the resin are only exemplary, and the resin can also be used for other purposes, in addition to such uses.

The weight-average molecular weight (Mw) of the resin is preferably 2,000 to 2,000,000. The upper limit is preferably 1,000,000 or less and more preferably 500,000 or less. The lower limit is preferably 3,000 or more and more preferably 5,000 or more.

The content of the resin in the coloring composition of the embodiment of the present invention is preferably 1% to 80% by mass with respect to the total solid content of the coloring composition. The lower limit is more preferably 10% by mass or more and still more preferably 20% by mass or more. The upper limit is more preferably 60% by mass or less and still more preferably 40% by mass or less.

The coloring composition of the embodiment of the present invention can include a resin having an amine value. By using the resin having an amine value, it is possible to improve the dispersibility of the magenta pigment in the composition. An example of the resin having an amine value includes a resin including a nitrogen atom in at least one of a main chain or a side chain. Furthermore, from the viewpoint of the dispersibility of the magenta pigment or the like, the resin having a nitrogen atom in the main chain is preferable. Examples of the resin having a nitrogen atom in the main chain include oligoimine-based resins as described later. The resin having an amine value can be preferably used as a dispersant.

In addition, the resin having an amine value preferably further has an acid value. That is, the resin having an amine value preferably further has an acid group. By using the resin, excellent photolithographic properties are easily obtained while improving the dispersibility of the magenta pigment. Furthermore, the occurrence of mixed color between other layers after forming patterns can be effectively suppressed.

An amine value of the resin having an amine value is preferably 10 to 200 mgKOH/g. The upper limit of the amine value is preferably 180 mgKOH/g or less and more preferably 150 mgKOH/g or less. The lower limit of the amine value is preferably 15 mgKOH/g or more and more preferably 20 mgKOH/g or more.

An acid value of the resin having an amine value is preferably 10 mgKOH/g or more. The upper limit of the acid value is preferably 200 mgKOH/g or less and more preferably 150 mgKOH/g or less. The lower limit of the acid value is preferably 12 mgKOH/g or more, more preferably 15 mgKOH/g or more, and still more preferably 30 mgKOH/g or more.

The coloring composition of the embodiment of the present invention preferably includes a resin having an acid value of 50 mgKOH/g or more and more preferably includes a resin having an acid value of 80 mgKOH/g or more. According to this aspect, a resin having more excellent photolithographic properties is obtained. The upper limit of the acid value of the above-mentioned resin is preferably 500 mgKOH/g or less, more preferably 400 mgKOH/g or less, and still more preferably 250 mgKOH/g or less. The resin having an acid value of 50 mgKOH/g or more can be used as a binder or a dispersant. Among those, for the reason that more excellent photolithographic properties can be easily obtained, the resin having an acid value of 50 mgKOH/g or more is preferably a resin used as the dispersant.

(Dispersant)

The coloring composition of the embodiment of the present invention preferably includes a dispersant as a resin. Examples of the dispersant include polymer dispersants (for example, polyamide amine or a salt thereof, polycarboxylic acid or a salt thereof, high molecular weight unsaturated acid ester, modified polyurethane, modified polyester, modified poly(meth)acrylate, a (meth)acrylic copolymer, or a naphthalene sulfonic acid formalin condensate), polyoxyethylene alkylphosphate ester, polyoxyethylene alkyl amine, or alkanolamine.

The polymer dispersant can be further classified into a linear polymer, a terminal-modified polymer, a graft polymer, and a block polymer according to the structure thereof. The polymeric dispersant adsorbs on a surface of a pigment and acts to prevent reaggregation. Therefore, examples of a preferred structure of the polymer dispersant include a terminal-modified polymer, a graft polymer, and a block polymer, each of which has an anchor site for adsorbing on the pigment surface. In addition, dispersants described in paragraph Nos. 0028 to 0124 of JP2011-070156A or dispersants described in JP2007-277514A are preferably used. The contents of the publications are incorporated herein by reference.

In the present invention, the resin is preferably a resin including a repeating unit having a graft chain as a side chain (hereinafter also referred to as a graft resin). According to this aspect, the dispersibility of the pigment can be further improved. Here, the graft chain means a polymer chain branched from a main chain of the repeating unit. The length of the graft chain is not particularly limited, and in a case where the graft chain gets longer, a steric repulsion effect is enhanced, and thus, the dispersibility of the pigment or the like can be increased. In the graft chain, the number of atoms excluding the hydrogen atoms is preferably 40 to 10,000, the number of atoms excluding the hydrogen atoms is more preferably 50 to 2,000, and the number of atoms excluding the hydrogen atoms is still more preferably 60 to 500.

The graft chain preferably includes at least one structure selected from a polyester chain, a polyether chain, a poly (meth)acryl chain, a polyurethane chain, a polyurea chain, or a polyamide chain, more preferably includes at least one structure selected from a polyester chain, a polyether chain, or a poly(meth)acryl chain, and still more preferably includes a polyester chain.

A terminal structure of the graft chain is not particularly limited. The terminal structure of the graft chain may be a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among those, from the viewpoint of improvement of the dispersibility of the pigment or the like, a group having a steric repulsion effect is preferable, and an alkyl group or alkoxy group having 5 to 24 carbon atoms is preferable. The alkyl group and the alkoxy group may be any of linear, branched, and cyclic forms, and are preferably linear or branched.

An example of the graft resin includes a resin having a repeating unit represented by any one of the following Formulae (1) to (4).

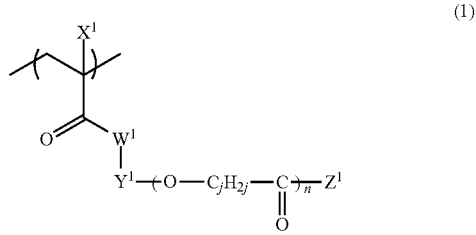

(1)

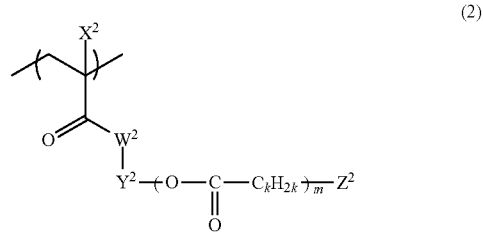

(2)

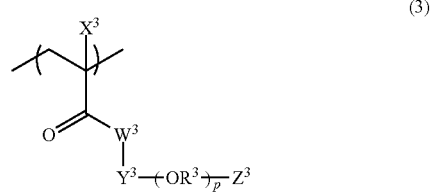

(3)

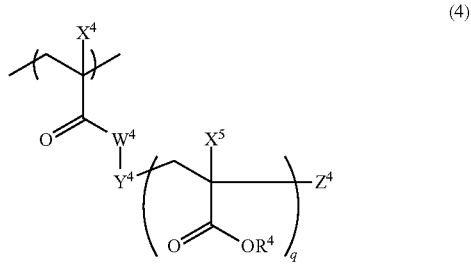

(4)

In Formulae (1) to (4), $W^1$, $W^2$, and $W^4$ each independently represent an oxygen $W^3$, atom or NH, $X^1$, $X^2$, $X^3$, $X^4$, and $X^5$ each independently represent a hydrogen atom, a monovalent organic group, or a halogen atom, $Y^1$, $Y^2$, $Y^3$, and $Y^4$ each independently represent a divalent linking group, $Z^1$, $Z^2$, $Z^3$, and $Z^4$ each independently represent a monovalent organic group, $R^3$ represents an alkylene group, $R^4$ represents a hydrogen atom or a monovalent organic group, n, m, p, and q each independently represent an integer of 1 to 500, and j and k each independently represent an integer of 2 to 8. In Formula (3), in a case where p is 2 to 500, a plurality of $R^3$'s may be the same or different from each other. In Formula (4), in a case where q is 2 to 500, a plurality of $X^5$'s and $R^4$'s may be the same or different from each other.

$W^1$, $W^2$, $W^3$, and $W^4$ are preferably an oxygen atom. $X^1$, $X^2$, $X^3$, $X^4$, and $X^5$ are preferably a hydrogen atom or an alkyl group having 1 to 12 carbon atoms, more preferably a hydrogen atom or a methyl group, and particularly preferably a methyl group. $Y^1$, $Y^2$, $Y^3$, and $Y^4$ each independently represent a divalent linking group and the linking group is not particularly restricted in the structure. Examples of the divalent linking group include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, and a group formed by combination of two or more of these groups. A structure of a monovalent organic group represented by $Z^1$, $Z^2$, $Z^3$, and $Z^4$ is not particularly limited, and specific examples thereof include an alkyl group, a hydroxyl group, an alkoxy group, an aryloxy group, a heteroaryloxy group, an alkylthioether group, an arylthioether group, a heteroarylthioether group, and an amino group. From the viewpoint of improving dispersibility, the organic group represented by $Z^1$, $Z^2$, $Z^3$, and $Z^4$ preferably has a steric repulsion effect, is each independently preferably an alkyl group or alkoxy group having 5 to 24 carbon atoms, and in particular, still more preferably a branched alkyl group having 5 to 24 carbon atoms, a cyclic alkyl group having 5 to 24 carbon atoms, or an alkoxy group having 5 to 24 carbon atoms. An alkyl group included in the alkoxy group may be any of linear, branched chain, or cyclic forms.

In Formulae (1) to (4), n, m, p and q each independently represent an integer of 1 to 500. In addition, in Formulae (1) and (2), j and k each independently represent an integer of 2 to 8. j and k in Formulae (1) and (2) are preferably an integer of 4 to 6 and most preferably 5 from the viewpoint of dispersion stability and developability.

In Formula (3), $R^3$ represents an alkylene group, an alkylene group having 1 to 10 carbon atoms is preferable, and an alkylene group having 2 or 3 carbon atoms is more preferable. In a case where p is 2 to 500, a plurality of $R^3$'s may be the same or different from each other.

In Formula (4), $R^4$ represents a hydrogen atom or a monovalent organic group. The monovalent organic group is not particularly limited in the structure. Examples of the monovalent organic group include a hydrogen atom, an alkyl group, an aryl group, and a heteroaryl group, and preferably the hydrogen atom or the alkyl group. In Formula (4), in a case where q is 2 to 500, a plurality of $X^5$'s and $R^4$'s may independently be the same or different from each other.

Examples of the graft resin include a resin having the following structure. In addition, with regard to details of the graft resin, reference can be made to the description in paragraph Nos. 0025 to 0094 of JP2012-255128A, and the contents thereof are incorporated herein by reference.

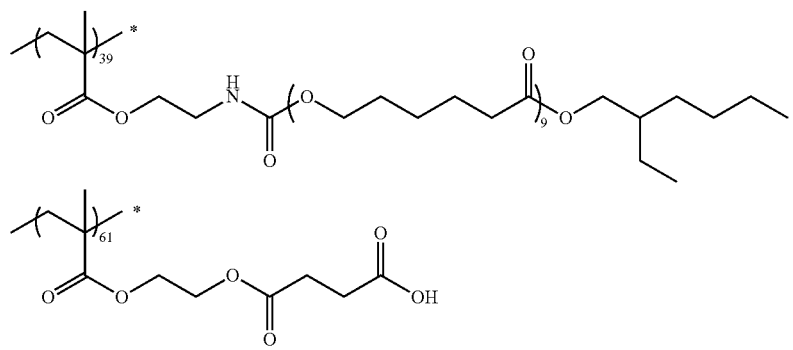

In addition, in the present invention, a resin including a nitrogen atom in the main chain is preferably used. The resin including a nitrogen atom in the main chain (hereinafter, also referred to as oligoimine-based resin) is preferable to include at least one repeating unit having a nitrogen atom selected from a poly(lower alkyleneimine)-based repeating unit, a polyallylamine-based repeating unit, a polydiallylamine-based repeating unit, a metaxylene diamine-epichlorohydrin polycondensate-based repeating unit, or a polyvinylamine-based repeating unit.

In addition, as an oligoimine-based resin, a resin which has a repeating unit having a partial structure X composed of a functional group with pKa of 14 or less and a repeating unit having a side chain including an oligomer chain or a polymer chain Y having 40 to 10,000 atoms is preferable.

For example, an oligoimine-based resin is preferably a resin including a repeating unit represented by Formula (I-1), a repeating unit represented by Formula (I-2), and/or a repeating unit represented by Formula (I-2a).

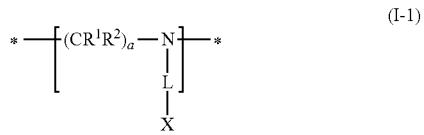

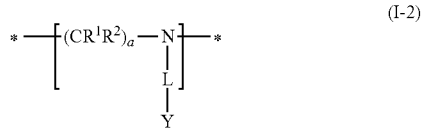

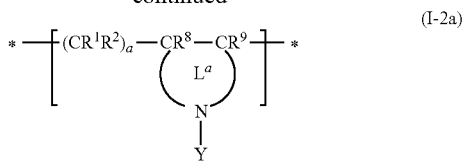

$R^1$ and $R^2$ each independently represent a hydrogen atom, a halogen atom, or an alkyl group (preferably 1 to 6 carbon atoms). Each a independently represents an integer of 1 to 5. * represents a linking site between repeating units.

$R^8$ and $R^9$ are groups having the same definition as $R^1$.

L is a linking group which consists of a single bond, an alkylene group (preferably 1 to 6 carbon atoms), an alkenylene group (preferably 2 to 6 carbon atoms), an arylene group (preferably 6 to 24 carbon atoms), a heteroarylene group (preferably 1 to 6 carbon atoms), an imino group (preferably 0 to 6 carbon atoms), an ether group, a thioether group, a carbonyl group, or a combination thereof. Among those, a single bond or —$CR^5R^6$—$NR^7$— (an imino group is located on the X or Y side) is preferable. Here, $R^5$ and $R^6$ each independently represent a hydrogen atom, a hydrogen atom, or an alkyl group (preferably 1 to 6 carbon atoms). $R^7$ represents a hydrogen atom or an alkyl group having 1 to 6 carbon atoms.

$L^a$ is a structural site that forms a ring structure together with $CR^8CR^9$, and N, and is preferably a structural site forming a non-aromatic heterocycle having 3 to 7 carbon atoms together with the carbon atom of $CR^8CR^9$. Furthermore, $L^a$ is preferably a structural site forming a five- to seven-membered non-aromatic heterocycle together with the carbon atom of $CR^8CR^9$ and N (nitrogen atom), more preferably a structural site forming five-membered non-aromatic heterocycle, and particularly preferably a structural site forming pyrrolidine. Furthermore, the structural site may have a substituent such as an alkyl group.

X represents a group having a functional group with pKa of 14 or less.

Y represents a side chain having 40 to 10,000 atoms.

Furthermore, an oligoimine-based resin may contain one or more repeating units selected from the repeating units represented by Formulae (I-3), (I-4), and (I-5), as a copolymerization component. By the oligoimine-based resin containing the repeating units, dispersibility of the magenta pigment can be further improved.

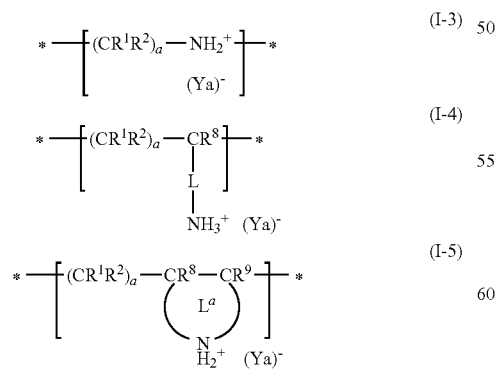

$R^1$, $R^2$, $R^8$, $R^9$, L, $L^a$, a, and * have the same definitions defined in Formulae (I-1), (I-2), and (I-2a). Ya represents a side chain which has an anionic group having 40 to 10,000 atoms. A repeating unit represented by Formula (I-3) can be formed by adding an oligomer or polymer which has a group reacting with an amine to form a salt to a resin which has a primary or secondary amino group in the main chain and then reacting with each other.

With regard to the oligoimine-based resin, reference can be made to the description in paragraph Nos. 0102 to 0166 of JP2012-255128A, and the contents thereof are incorporated herein by reference. Specific examples of the oligoimine-based resin include resins shown below. In addition, the resins described in paragraph Nos. 0168 to 0174 of JP2012-255128A can be used.

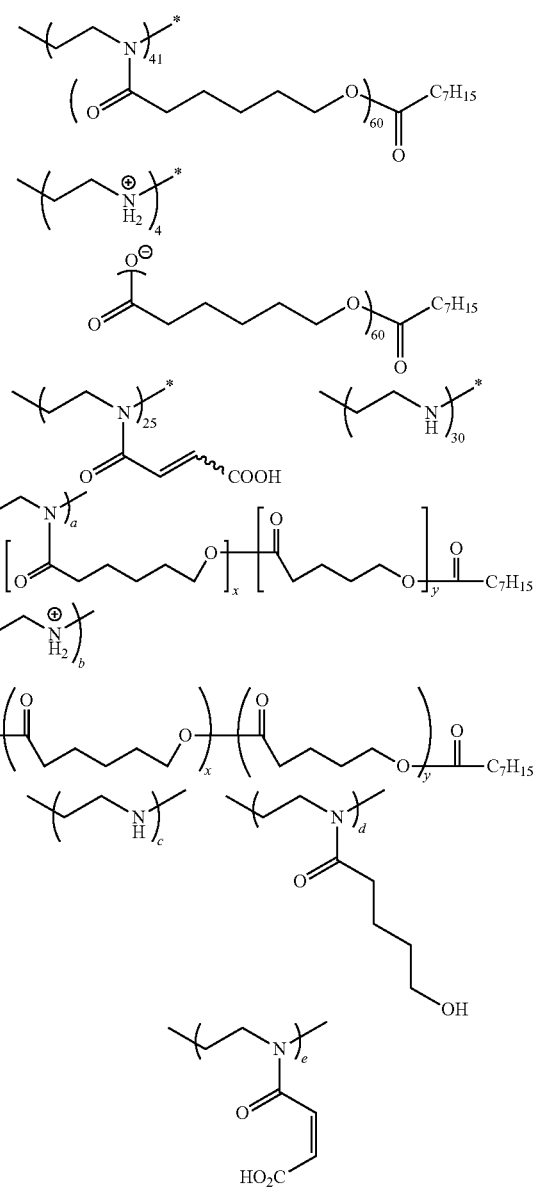

a/b/c/d/e = 36/4/35/1/24 (mol %)
x = 48 y = 12

A commercially available product can also be used as the resin for the dispersant. For example, a product described in paragraph No. 0129 of JP2012-137564A can be used as the dispersant. An example thereof includes Disperbyk-111 (manufactured by BYK-Chemie). The resin demonstrated as the dispersant can also be used for other applications in addition to the dispersant. For example, the resin can also be used for a binder.

A content of the dispersant is preferably 1 to 200 parts by mass with respect to 100 parts by mass of the pigment. The lower limit is preferably 5 parts by mass or more and more preferably 10 parts by mass or more. The upper limit is preferably 150 parts by mass or less and more preferably 100 parts by mass or less.

(Alkali-Soluble Resin)

The coloring composition of the embodiment of the present invention can contain an alkali-soluble resin as a resin. By containing the alkali-soluble resin, developability is improved. The alkali-soluble resin can also be used as a dispersant or a binder.

The alkali-soluble resin can be appropriately selected from resins having a group promoting an alkali dissolution. Examples of the group promoting an alkali dissolution (hereinafter also referred to as an acid group) include a carboxyl group, a phosphoric acid group, a sulfo group, and a phenolic hydroxyl group, and preferably the carboxyl group. The acid groups included in the alkali-soluble resin may be of one kind or two or more kinds thereof.

The weight-average molecular weight (Mw) of the alkali-soluble resin is preferably 5,000 to 100,000. In addition, the number-average molecular weight (Mn) of the alkali-soluble resin is preferably 1,000 to 20,000.

As the alkali-soluble resin, from the viewpoint of heat resistance, a polyhydroxystyrene-based resin, a polysiloxane-based resin, an acrylic-based resin, an acrylamide-based resin, or an acrylic/acrylamide copolymer resin is preferable. In addition, from the viewpoint of suppressing developability, an acrylic-based resin, an acrylamide-based resin, or an acrylic/acrylamide copolymer resin is preferable.

The alkali-soluble resin is preferably a polymer having a carboxyl group in the side chain. Examples thereof include copolymers having a repeating unit derived from a monomer such as a methacrylic acid, an acrylic acid, an itaconic acid, an crotonic acid, a maleic acid, a 2-carboxyethyl(meth)acrylic acid, a vinylbenzoic acid, and a partially esterified maleic acid, alkali-soluble phenol resins such as a novolac type resin, an acidic cellulose derivative having a carboxyl group in the side chain, and a polymer obtained by adding an acid anhydride to a polymer having a hydroxyl group. In particular, a copolymer of a (meth)acrylic acid and another monomer copolymerizable therewith is suitable as the alkali-soluble resin. Examples of another monomer copolymerizable with the (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. Further, examples of other monomer include the N-position-substituted maleimide monomers described in JP1998-300922A (JP-H10-300922A), such as N-phenylmaleimide and N-cyclohexylmaleimide. Such other monomers copolymerizable with (meth)acrylic acids may be of one kind or of two or more kinds thereof.

As the alkali-soluble resin, a benzyl (meth)acrylate/(meth)acrylic acid copolymer, a benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. Further, a copolymer obtained by copolymerizing 2-hydroxyethyl (meth)acrylate and other monomers, the 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used. Furthermore, as a commercially available product, for example, FF-426 (manufactured by Fujikura Kasei Co., Ltd.) can also be used.

An alkali-soluble resin having a polymerizable group can also be used as the alkali-soluble resin. Examples of the polymerizable group include a (meth)allyl group and a (meth)acryloyl group. An alkali-soluble resin having a polymerizable group is preferably an alkali-soluble resin having a polymerizable group in the side chain. Specific examples of the alkali-soluble resin having a polymerizable group include a resin having the following structure. Examples of a commercially available product of the alkali-soluble resin having a polymerizable group include Dianal NR Series (manufactured by Mitsubishi Rayon Co., Ltd.), Photomer 6173 (polyurethane acrylate oligomer, manufactured by Diamond Shamrock Corp.), Viscoat R-264 and KS Resist 106 (all manufactured by Osaka Organic Chemical Industry Ltd.), Cyclomer P series (for example, ACA230AA) and Placcel CF 200 series (all manufactured by Daicel Corporation), Ebecryl 3800 (manufactured by Daicel UCB Company, Ltd.), Acrycure RD-F8 (manufactured by Nippon Shokubai Co., Ltd.), and DP-1305 (manufactured by Fuji Fine Chemicals.).

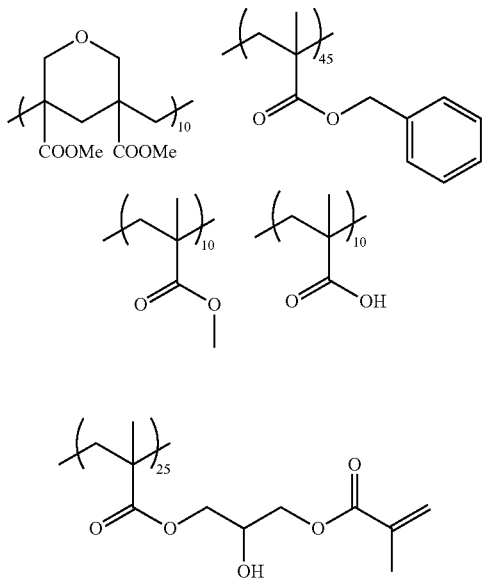

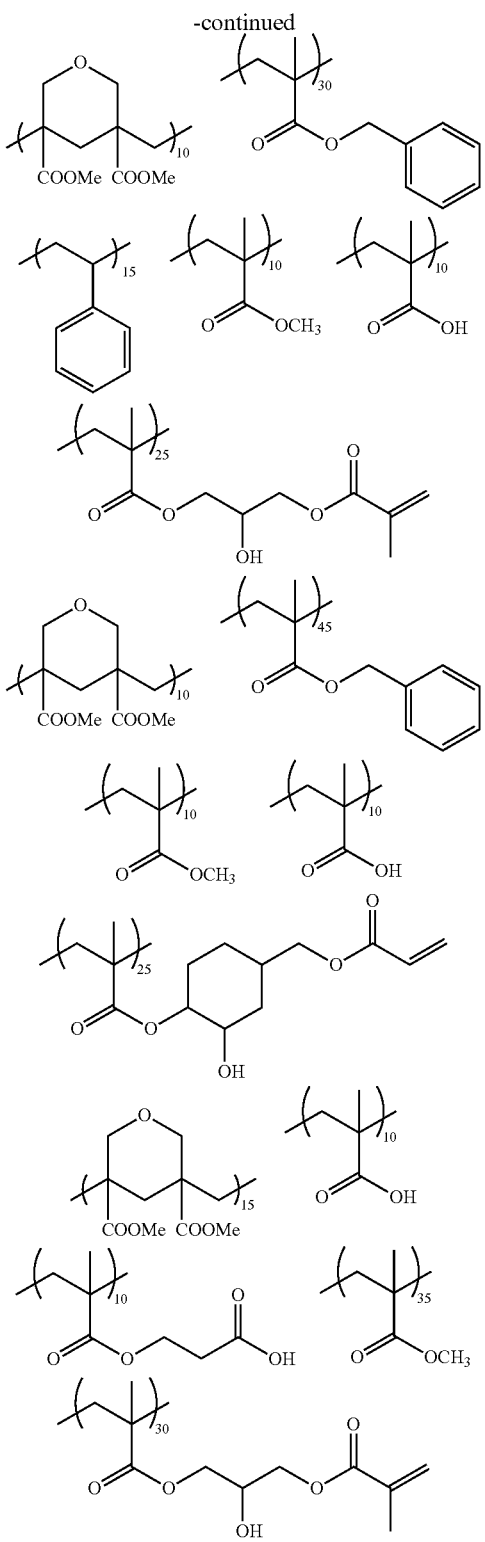

The alkali-soluble resin is preferable to include a polymer obtained by polymerizing monomer components including at least one compound (hereinafter, in some case, the compound is also referred to as an "ether dimer") selected from compounds represented by following Formula (ED1) or compounds represented by Formula (1) of JP2010-168539A.

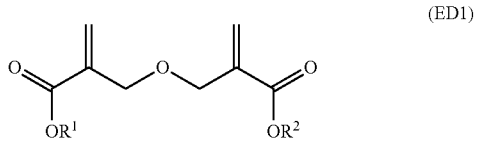

In Formula (ED1), $R^1$ and $R^2$ each independently represent a hydrogen atom or a hydrocarbon group having 1 to 25 carbon atoms, which may have a substituent.

With regard to the specific examples of the ether dimer, reference can be made to paragraph No. 0317 of JP2013-029760A, and the contents thereof are incorporated herein by reference. The ether dimers may be used singly or in combination of two or more kinds thereof.

The alkali-soluble resin may include a repeating unit derived from a compound represented by Formula (X).

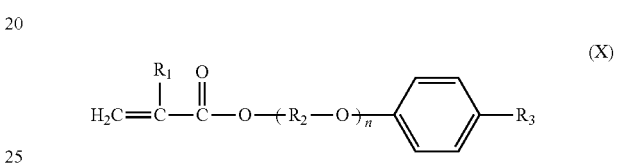

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms, which may include a benzene ring. n represents an integer of 1 to 15.

In Formula (X), the number of carbon atoms of the alkylene group represented by $R_2$ is preferably 2 to 3. In addition, the number of carbon atoms of the alkyl group represented by $R_3$ is preferably 1 to 10. The alkyl group represented by $R_3$ may include a benzene ring. Examples of the alkyl group including a benzene ring represented by $R_3$ include a benzyl group, a 2-phenyl (iso)propyl group and the like.

With regard to the alkali-soluble resin, reference can be made to the description in paragraph Nos. 0558 to 0571 of JP2012-208494A (paragraph Nos. 0685 to 0700 of the corresponding US2012/0235099A), and the contents thereof are incorporated herein by reference. In addition, a copolymer (B) described in paragraph Nos. 0029 to 0063 of JP2012-032767A and the alkali-soluble resins used in Examples, binder resins described in paragraph Nos. 0088 to 0098 of JP2012-208474A and binder resins used in Examples, binder resins described in paragraph Nos. 0022 to 0032 of JP2012-137531A and binder resins used in Examples, binder resins described in paragraph Nos. 0132 to 0143 of JP2013-024934A and binder resins used in Examples, binder resins described in paragraph Nos. 0092 to 0098 of JP2011-242752A and Examples, and binder resins described in paragraph Nos. 0030 to 0072 of JP2012-032770A can also be used. The contents of the publications are incorporated herein by reference.

An acid value of the alkali-soluble resin is preferably 30 to 500 mgKOH/g. The lower limit is more preferably 50 mgKOH/g or more, still more preferably 70 mgKOH/g or more, and particularly preferably 80 mgKOH/g or more. The upper limit is more preferably 400 mgKOH/g or less and still more preferably 250 mgKOH/g or less.

The content of the alkali-soluble resin is preferably 1% to 80% by mass with respect to the total solid content of the coloring composition. The lower limit is more preferably 10% by mass or more and still more preferably 20% by mass or more. The upper limit is more preferably 60% by mass or less and still more preferably 40% by mass or less. The coloring composition of the embodiment of the present invention may include only one kind or two or more kinds of the alkali-soluble resin. In a case where two or more kinds of the magenta pigments are included, the total amount thereof is preferably within the above-mentioned range.

<<Solvent>>

The coloring composition of the embodiment of the present invention preferably contains a solvent. The solvent is preferably an organic solvent. The solvent is not particularly limited as long as it satisfies the solubility of the respective components or the coatability of the coloring composition.

Examples of the organic solvent include the following organic solvents. Examples of esters include ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate. Examples of ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate. Examples of the ketones include methyl ethyl ketone, cyclohexanone, cyclopentanone, 2-heptanone, and 3-heptanone. Suitable examples of the aromatic hydrocarbons include toluene and xylene. However, it is preferable in some cases to reduce aromatic hydrocarbons (benzene, toluene, xylene, ethylbenzene, and the like) (for example, the amount can be set to 50 ppm (parts per million) by mass or less, 10 ppm by mass or less, or 1 ppm by mass or less with respect to the total amount of the organic solvent) as a solvent for a reason such as an environmental aspect.

The organic solvents may be used singly or in combination of two or more kinds thereof. In a case where the organic solvents are used in combination of two or more kinds thereof, the solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol monomethyl ether acetate.

In the present invention, the organic solvent preferably has the content of peroxides of 0.8 mmol/L or less, and more preferably, it does not substantially include peroxides. Further, it is preferable to use an organic solvent having a small metal content, and for example, the metal content of the organic solvent is preferably 10 ppb (parts per billion) by mass or less. The metal content of the organic solvent is at a level of ppt (parts per trillion) by mass, as desired, and such a high-purity solvent is provided by, for example, Toyo Kasei Kogyo Co., Ltd. (The Chemical Daily, Nov. 13, 2015).

The content of the solvent is preferably an amount such that the total solid content of the coloring composition is 5% to 80% by mass. The lower limit is preferably 10% by mass or more. The upper limit is preferably 60% by mass or less, more preferably 50% by mass or less, and still more preferably 40% by mass or less.

<<Compound Having Epoxy Group>>

The coloring composition of the embodiment of the present invention can contain a compound having an epoxy group (hereinafter also referred to as an epoxy compound). The epoxy compound is preferably a compound having 1 to 100 epoxy groups per molecule. The lower limit of the number of the epoxy groups is more preferably 2 or more. The upper limit of the number of the epoxy groups can be set to, for example, 10 or less, or to 5 or less.

The epoxy equivalent (=the molecular weight of the epoxy compound/the number of epoxy groups) of the epoxy compound is preferably 500 g/equivalent or less, more preferably 100 to 400 g/equivalent, and still more preferably 100 to 300 g/equivalent.

The epoxy compound may be either a low-molecular-weight compound (for example, a molecular weight of less than 1,000) or a polymer compound (macromolecule) (for example, a molecular weight of 1,000 or more, and in a case of a polymer, a weight-average molecular weight of 1,000 or more). The weight-average molecular weight of the epoxy compound is preferably 200 to 100,000 and more preferably 500 to 50,000. The upper limit of the weight-average molecular weight is more preferably 10,000 or less, still more preferably 5,000 or less, and even still more preferably 3,000 or less.

As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A can also be used. The contents of the publications are incorporated herein by reference.

In a case where the coloring composition of the embodiment of the present invention contains an epoxy compound, the content of the epoxy compound is preferably 0.1% to 40% by mass with respect to the total solid content of the coloring composition. The lower limit is, for example, more preferably 0.5% by mass or more, and still more preferably 1% by mass or more. The upper limit is, for example, more preferably 30% by mass or less, and still more preferably 20% by mass or less. These epoxy compounds may be used singly or in combination of two or more kinds thereof. In a case where the polymerizable compounds are used in combination of two or more kinds thereof, the total amount thereof is preferably within the range.

The coloring composition of the embodiment of the present invention can also substantially contain no epoxy compound. In a case where the coloring composition of the embodiment of the present invention does not substantially contain the epoxy compound, the content of the epoxy compound is preferably 0.05% by mass or less, more preferably 0.01% by mass or less with respect to the total solid content of the coloring composition, and the coloring composition even still more preferably contains no epoxy compound.

<<Curing Accelerator>>

The coloring composition of the embodiment of the present invention may include a curing accelerator for the purpose of improving the hardness of a pattern or lowering a curing temperature. Examples of the curing accelerator include a thiol compound.

Examples of the thiol compound include a polyfunctional thiol compound having two or more mercapto groups in a molecule thereof. The polyfunctional thiol compound may also be added for the purpose of alleviating problems in stability, smell, developability, adhesiveness, or the like. The polyfunctional thiol compound is preferably a secondary alkanethiol and more preferably a compound having a structure represented by Formula (T1).

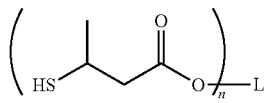

Formula (T1)

In Formula (T1), n represents an integer of 2 to 4 and L represents a divalent to tetravalent linking group.

In Formula (T1), it is preferable that L is an aliphatic group having 2 to 12 carbon atoms. In Formula (T1), it is more preferable that n is 2 and L is an alkylene group having 2 to 12 carbon atoms. Specific examples of the polyfunctional thiol compounds include compounds represented by Structural Formulae (T2) to (T4), and the compound represented by Formula (T2) is preferable. These thiol compounds can be used singly or in combination of two or more kinds thereof.

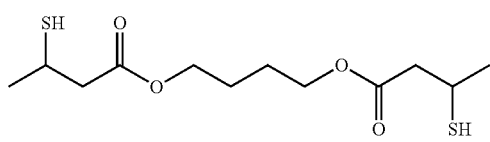
(T2)

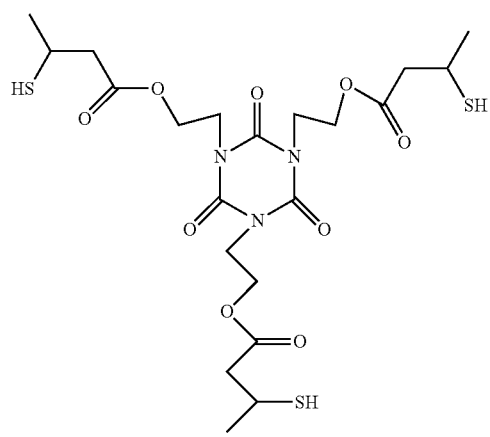
(T3)

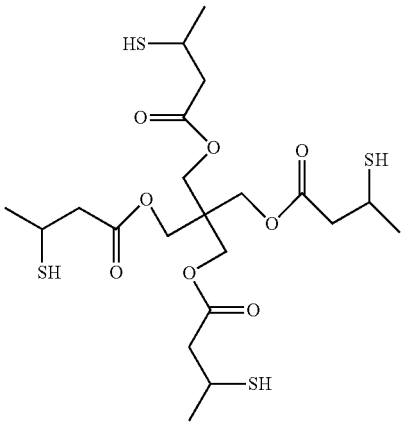
(T4)

Moreover, as the curing accelerator, a methylol-based compound (for example, the compounds exemplified as a crosslinking agent in paragraph No. 0246 of JP2015-034963A), amines, phosphonium salts, amidine salts, amide compounds (each of which are the curing agents described in, for example, paragraph No. 0186 of JP2013-041165A), base generators (for example, the ionic compounds described in JP2014-055114A), isocyanate compounds (for example, the compounds described in paragraph No. 0071 of JP2012-150180A), alkoxysilane compounds (for example, the alkoxysilane compounds having epoxy groups, described in JP2011-253054A), onium salt compounds (for example, the compounds exemplified as an acid generator in paragraph No. 0216 of JP2015-034963A, and the compounds described in JP2009-180949A), or the like can be used.

In a case where the coloring composition of the embodiment of the present invention contains the curing accelerator, the content of the curing accelerator is preferably 0.3% to 8.9% by mass, and more preferably 0.8% to 6.4% by mass, with respect to the total solid content of the coloring composition.

<<Pigment Derivative>>

The coloring composition of the embodiment of the present invention preferably contains a pigment derivative. Examples of the pigment derivative include a compound having a structure in which a part of a chromophore is substituted with an acid group, a basic group, or a phthalimidemethyl group.

Examples of a chromophore constituting the pigment derivative include a quinoline-based skeleton, a benzimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton, the quinoline-based skeleton, the benzimidazolone-based skeleton, the diketopyrrolopyrrole-based skeleton, the azo-based skeleton, the quinophthalone-based skeleton, the isoindoline-based skeleton, and the phthalocyanine-based skeleton are preferable, and the azo-based skeleton and the benzimidazolone-based skeleton are more preferable. As the acid group contained in the pigment derivative, a sulfo group or a carboxyl group is preferable and the sulfo group is more preferable. As the basic group contained in the pigment derivative, an amino group is preferable and a tertiary amino group is more preferable. With regard to specific examples of the pigment derivative, reference can be made to the description in paragraph Nos. 0162 to 0183 of JP2011-252065A, and the contents thereof are incorporated herein by reference.

In a case where the coloring composition of the embodiment of the present invention contains a pigment derivative, the content of the pigment derivative is preferably 1 to 30 parts by mass, and more preferably 3 to 20 parts by mass, with respect to 100 parts by mass of the pigment. The pigment derivative may be used singly or in combination of two or more kinds thereof.

<<Surfactant>>

The coloring composition of the embodiment of the present invention preferably contains a surfactant. As the surfactant, various surfactants such as a fluorine-based surfactant, a nonionic surfactant, a cationic surfactant, an anionic surfactant, and a silicone-based surfactant can be used, and the fluorine-based surfactant is preferable for a reason that coatability can be further improved.

By incorporating the fluorine-based surfactant into the coloring composition of the embodiment of the present invention, liquid characteristics in a case of preparation of a coating liquid are further improved, and thus, the evenness of coating thickness can be further improved. That is, in a case where a film is formed using the coating liquid to which a coloring composition containing the fluorine-based surfactant has been applied, the interface tension between a surface to be coated and the coating liquid is reduced to improve uniformity of the drying with respect to the film. Therefore, formation of a film with a uniform thickness which exhibits little coating unevenness can be more suitably performed.

The fluorine content in the fluorine-based surfactant is preferably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film or liquid saving properties and the solubility of the surfactant in the coloring composition is also good.

Examples of the fluorine-based surfactant include MEGAFACE F171, F172, F173, F176, F177, F141, F142, F143, F144, R30, F437, F475, F479, F482, F554, and F780 (all manufactured by DIC Corporation), FLUORAD FC430, FC431, and FC171 (all manufactured by Sumitomo 3M), SURFLON S-382, SC-101, SC-103, SC-104, SC-105, SC-1068, SC-381, SC-383, and S-393, and KH-40 (all manufactured by Asahi Glass Co., Ltd.), and PF636, PF656, PF6320, PF6520, and PF7002 (all manufactured by OMNOVA). Further, as the fluorine-based surfactant, the compounds described in paragraph Nos. 0015 to 0158 of JP2015-117327A, and the compounds described in paragraph Nos. 0117 to 0132 of JP2011-132503A can be used. As the fluorine-based surfactant, a block polymer can also be used, and specific examples thereof include the compounds described in JP2011-089090A.

As the fluorine-based surfactant, an acrylic compound, which has a molecular structure having a functional group containing a fluorine atom and in which by application of heat to the molecular structure, the functional group containing a fluorine atom is cut to volatilize a fluorine atom, can also be suitably used. Examples of the fluorine-based surfactant include MEGAFACE DS series (manufactured by DIC Corporation, The Chemical Daily, Feb. 22, 2016, Nikkei Business Daily, Feb. 23, 2016), for example, MEGAFACE DS-21, which may also be used.

As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used, and the following compounds are also exemplified as a fluorine-based surfactant for use in the present invention. In General Formula below, % representing the ratio of the repeating unit is % by mole.

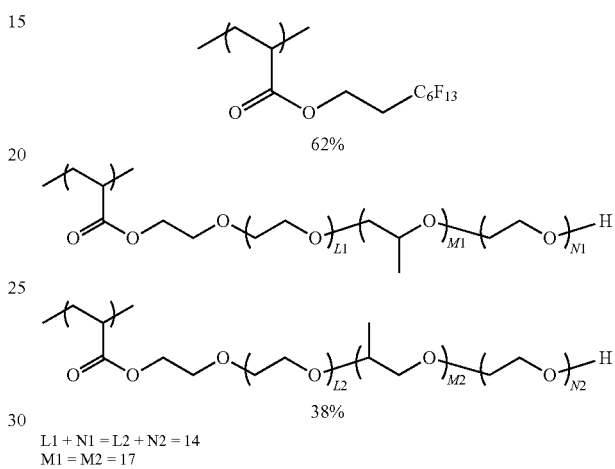

$L1 + N1 = L2 + N2 = 14$
$M1 = M2 = 17$

The weight-average molecular weight of the compounds is preferably 3,000 to 50,000, and is, for example, 14,000.

A fluorine-containing polymer having an ethylenically unsaturated bonding group in a side chain can also be used as the fluorine-based surfactant. Specific examples thereof include the compounds described in paragraph Nos. 0050 to 0090 and paragraph Nos. 0289 to 0295 of JP2010-164965A. Examples of commercially available products thereof include MEGAFACE RS-101, RS-102, RS-718-K, and RS-72-K, all of which are manufactured by DIC Corporation.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin Chemical Industry Co., Ltd.).

Specific examples of the cationic surfactant include an organosiloxane polymer KP-341 (manufactured by Shin-Etsu Chemical Co., Ltd.), a (meth)acrylic acid-based (co) polymer POLYFLOW No. 75, No. 90, and No. 95 (manufactured by KYOEISHA CHEMICAL CO., LTD.), and W001 (manufactured by Yusho Co., Ltd.).

Examples of the anionic surfactant include W004, W005, and W017 (manufactured by Yusho Co., Ltd.), and SANDET BL (manufactured by Sanyo Chemical Industries, Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP-341, KF6001, and KF6002 (all manufactured by Shin-Etsu Chemical Co., Ltd.), and BYK307, BYK323, and BYK330 (all manufactured by BYK Chemie).

The content of the surfactant is preferably 0.001% to 2.0% by mass, and more preferably 0.005% to 1.0% by mass, with respect to the total solid content of the coloring composition. The surfactant may be used singly or in combination of two or more kinds thereof. In a case where two or more kinds of surfactants are included, the total amount thereof is preferably within the range.

<<Silane Coupling Agent>>

The coloring composition of the embodiment of the present invention can contain a silane coupling agent. In the present invention, the silane coupling agent means a silane compound having a hydrolyzable group and another functional group. Further, the hydrolyzable group refers to a substituent that can be directly linked to a silicon atom to generate a siloxane bond by a hydrolysis reaction and/or a condensation reaction. Examples of the hydrolyzable group include a halogen atom, an alkoxy group, and an acyloxy group.

The silane coupling agent is preferably a silane compound having at least one selected from a vinyl group, an epoxy group, a styrene group, a methacryl group, an amino group, an isocyanurate group, a ureido group, a mercapto group, a sulfide group, or an isocyanate group, or an alkoxy group. Specific examples of the silane coupling agent include N-β-aminoethyl-γ-aminopropyl methyldimethoxysilane (KBM-602, manufactured by Shin-Etsu Chemical Co., Ltd.), N-β-aminoethyl-γ-aminopropyl trimethoxysilane (KBM-603, manufactured by Shin-Etsu Chemical Co., Ltd.), N-β-aminoethyl-γ-aminopropyl triethoxysilane (KBE-602, manufactured by Shin-Etsu Chemical Co., Ltd.), γ-aminopropyl trimethoxysilane (KBM-903, manufactured by Shin-Etsu Chemical Co., Ltd.), γ-aminopropyl triethoxysilane (KBE-903, manufactured by Shin-Etsu Chemical Co., Ltd.), 3-methacryloxypropyl trimethoxysilane (KBM-503, manufactured by Shin-Etsu Chemical Co., Ltd.), and 3-glycidoxypropyl trimethoxysilane (KBM-403, manufactured by Shin-Etsu Chemical Co., Ltd.). With regard to details of the silane coupling agent, reference can be made to the description in paragraph Nos. 0155 to 0158 of JP2013-254047A, and the contents thereof are incorporated herein by reference.

In a case where the coloring composition of the embodiment of the present invention contains a silane coupling agent, the content of the silane coupling agent is preferably 0.001% to 20% by mass, more preferably 0.01% to 10% by mass, and particularly preferably 0.1% to 5% by mass, with respect to the total solid content of the coloring composition. The coloring composition of the embodiment of the present invention may include one kind or two or more kinds of the silane coupling agents. In a case where the coloring composition includes two or more kinds of the silane coupling agent, the total amount thereof is preferably within the range.

<<Polymerization Inhibitor>>

The coloring composition of the embodiment of the present invention can contain a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and an N-nitrosophenylhydroxylamine salt (an ammonium salt, a cerous salt, or the like).

In a case where the coloring composition of the embodiment of the present invention contains a polymerization inhibitor, the content of the polymerization inhibitor is preferably 0.01% to 5% by mass with respect to the total solid content of the coloring composition. The coloring composition of the embodiment of the present invention may include one kind or two or more kinds of the polymerization inhibitor. In a case where two or more kinds of polymerization inhibitors are included, the total amount thereof is preferably within the range.

<<Other Additives>>

Various additives such as a filler, an adhesion promoter, an antioxidant, and an aggregation inhibitor can be blended into the coloring composition of the embodiment of the present invention, as desired. Examples of these additives include the additives described in paragraph Nos. 0155 and 0156 of JP2004-295116A, and the contents thereof are incorporated herein by reference. Further, as the antioxidant, for example, a phenol compound, a phosphorus-based compound (for example, the compounds described in paragraph No. 0042 of JP2011-090147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all of which are manufactured by ADEKA. The antioxidant may be used singly or in combination of two or more kinds thereof. The coloring composition of the embodiment of the present invention can contain the sensitizers or the light stabilizers described in paragraph No. 0078 of JP2004-295116A, or the thermal polymerization inhibitors described in paragraph No. 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 ppm by mass or less, and more preferably 0.01 to 10 ppm by mass. Further, the total amount of the inorganic metal salts in the coloring composition is preferably 100 ppm by mass or less and more preferably 0.5 to 50 ppm by mass.

The moisture content in the coloring composition of the embodiment of the present invention is usually 3% by mass or less, preferably 0.01 to 1.5% by mass, and more preferably 0.1 to 1.0% by mass. The moisture content can be measured by a Karl Fischer method.

The coloring composition of the embodiment of the present invention can be used after its viscosity is adjusted for the purposes of adjusting the state of a film surface (flatness or the like), adjusting a film thickness, or the like. The value of the viscosity can be appropriately selected as desired, and is, for example, preferably 0.3 mPa·s to 50 mPa·s, and more preferably 0.5 mPa·s to 20 mPa·s at 25° C. As for a method for measuring the viscosity, the viscosity can be measured, for example, with a temperature being adjusted to 25° C., using a viscometer RE85L (rotor: 1° 34' 'R24, measurement range of 0.6 to 1,200 mPa·s) manufactured by Toki Sangyo Co., Ltd.

A storage container for the coloring composition of the embodiment of the present invention is not particularly limited, and a known storage container can be used. Further, as the storage container, it is also preferable to use a multilayer bottle having an inner wall constituted with six layers from six kinds of resins or a bottle having a 7-layer structure from 6 kinds of resins for the purpose of suppressing incorporation of impurities into raw materials or compositions. Examples of such a container include the containers described in JP2015-123351A.

The coloring composition of the embodiment of the present invention can be preferably used for forming of a coloring pixel (preferably red coloring pixel) in a color filter, or the like. For example, the coloring composition of the embodiment of the present invention can be preferably used for a color filter which is used for a solid-state imaging element such as a charge coupled device (CCD) and a complementary metal-oxide semiconductor (CMOS), an image display device, or the like.

In a case where the coloring composition of the embodiment of the present invention is used as a color filter in applications for a liquid crystal display device, the voltage holding ratio of a liquid crystal display element comprising a color filter is preferably 70% or more, and more preferably 90% or more. Known means for obtaining a high voltage holding ratio can be incorporated as appropriate, and examples of typical means include use of high-purity materials (for example, reduction in ionic impurities) and control of the amount of acidic functional groups in a composition. The voltage holding ratio can be measured by, for example, the methods described in paragraph 0243 of JP2011-008004A and paragraphs 0123 to 0129 of JP2012-224847A.

<Method for Preparing Coloring Composition>

The coloring composition of the embodiment of the present invention can be prepared by mixing the above-mentioned components. In the preparation of the coloring composition, all the components may be dissolved and/or dispersed at the same time in a solvent to prepare the coloring composition, or the respective components may be appropriately left in two or more solutions or dispersion liquids and mixed to prepare the coloring composition upon use (during coating), as desired.

Furthermore, in the preparation of the coloring composition, a process for dispersing the pigment is preferably included. In the process for dispersing the pigment, examples of a mechanical force that is used for dispersion of the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. Further, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling process may be performed. With regard to the materials, the equipment, the process conditions, and the like used in the salt milling process, reference can be made to, for example, the description in JP2015-194521A and JP2012-046629A.

It is preferable that in the preparation of the coloring composition, a composition formed by mixing the respective components is filtered through a filter for the purpose of removing foreign matters, reducing defects, or the like. As the filter, any filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, nylon-6 and nylon-6,6), and a polyolefin resin (including a polyolefin resin having a high density and/or an ultrahigh molecular weight) such as polyethylene and polypropylene (PP). Among these materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 µm.

In addition, a fibrous filter material is also preferably used as the filter. Examples of the fibrous filter material include a polypropylene fiber, a nylon fiber, and a glass fiber. Examples of a filter using the fibrous filter material include filter cartridges of SBP type series (SBP008 and the like), TPR type series (TPR002, TPR005, and the like), or SHPX type series (SHPX003 and the like), all of which are manufactured by Roki Techno Co., Ltd.

In a case of using a filter, different filters may be combined. Here, the filtration with each of the filters may be performed once or may be performed twice or more times.

For example, filters having different pore diameters within the above-mentioned range may be combined. With regard to the pore diameter of the filter herein, reference can be made to nominal values of filter manufacturers. A commercially available filter can be selected from, for example, various filters provided by Nihon Pall Corporation (DFA4201NIEY and the like), Toyo Roshi Kaisha., Ltd., Nihon Entegris K.K. (formerly Nippon Microlith Co., Ltd.), Kitz Micro Filter Corporation, and the like.

In addition, the filtration through the first filter may be performed with only a dispersion liquid, the other components may be mixed therewith, and then the filtration through the second filter may be performed. As the second filter, a filter formed of the same material as that of the first filter, or the like can be used.

<Cured Film>

The cured film of an embodiment of the present invention is a cured film obtained from the above-mentioned coloring composition of the embodiment of the present invention. The cured film of the embodiment of the present invention can be preferably used as a color filter. In particular, the cured film of the embodiment of the present invention can be preferably used as a magenta coloring pixel of a color filter. The film thickness of the cured film can be appropriately adjusted depending on purposes. For example, the film thickness is preferably 5 µm or less, more preferably 3 µm or less, and still more preferably 1 µm or less. The lower limit of the film thickness is preferably 0.1 µm or more, more preferably 0.2 µm or more, and still more preferably 0.3 µm or more.

<Color Filter>

Next, the color filter of an embodiment of the present invention will be described.

The color filter of the embodiment of the present invention has the above-mentioned cured film of the embodiment of the present invention.

A preferred aspect of the color filter of the embodiment of the present invention includes a color filter having a magenta coloring pixel obtained from the photosensitive coloring composition, a cyan coloring pixel, and a yellow coloring pixel.

In the case where the color filter of the embodiment of the present invention has the magenta coloring pixel, the cyan coloring pixel, and the yellow coloring pixel, a ratio of an area (an area ratio) of the magenta coloring pixel, the cyan coloring pixel, and the yellow coloring pixel is not particularly limited. The area ratio of each pixel may be the same or different from each other. With regard to the cyan coloring pixel and the yellow coloring pixel, reference can be made to the description in JP2006-098684A, and the content thereof is incorporated herein by reference. Examples of colorants contained in the cyan coloring pixel include C. I. Pigment Blue 15:6, C. I. Pigment Blue 16, C.I. Pigment Green 7, and aluminum phthalocyanine. Examples of colorants contained in the yellow coloring pixel include C.I. Pigment Yellow 138, C.I. Pigment Yellow 139, C.I. Pigment Yellow 150, and C.I. Pigment Yellow 185.

In the color filter of the embodiment of the present invention, a pattern size of the magenta coloring pixel is preferably 0.7 to 2.0 µm, more preferably 0.7 to 1.4 µm, and still more preferably 0.7 to 1.1 µm. In addition, a thickness of the magenta coloring pixel is preferably 5 µm or less, more preferably 3 µm or less, and still more preferably 1 µm or less. The lower limit of the film thickness is preferably 0.1 µm or more, more preferably 0.2 µm or more, and still more preferably 0.3 µm or more.

In the color filter of the embodiment of the present invention, a pattern size of the cyan coloring pixel is preferably 0.7 to 2.0 µm, more preferably 0.7 to 1.4 µm, and still more preferably 0.7 to 1.1 µm. In addition, a thickness of the cyan coloring pixel is preferably 5 µm or less, more preferably 3 µm or less, and still more preferably 1 µm or less. The lower limit of the film thickness is preferably 0.1 µm or more, more preferably 0.2 µm or more, and still more preferably 0.3 µm or more.

In the color filter of the embodiment of the present invention, a pattern size of the yellow coloring pixel is preferably 0.7 to 2.0 µm, more preferably 0.7 to 1.4 µm, and still more preferably 0.7 to 1.1 µm. In addition, a thickness of the yellow coloring pixel is preferably 5 µm or less, more preferably 3 µm or less, and still more preferably 1 µm or less. The lower limit of the film thickness is preferably 0.1 µm or more, more preferably 0.2 µm or more, and still more preferably 0.3 µm or more.

The color filter of the embodiment of the present invention can be used for a solid-state imaging element such as a charge coupled device (CCD) and a complementary metal-oxide semiconductor (CMOS), an image display device, or the like. In addition, a solid-state imaging element including the color filter having the cyan coloring pixel, the magenta coloring pixel, and the yellow coloring pixel can be used in combination with a solid-state imaging element including a color filter having a red coloring pixel, a green coloring pixel, and a blue coloring pixel.

<Pattern Forming Method>

Next, a pattern forming method using the coloring composition of the embodiment of the present invention will be described. The pattern forming method includes a step of forming a coloring composition layer on a support using the coloring composition of the embodiment of the present invention and a step of forming a pattern onto the coloring composition layer by photolithography.

Pattern formation by the photolithography preferably includes a step of patternwise exposing the coloring composition layer and a step of removing unexposed areas by development to form a pattern. A step of baking the coloring composition layer (pre-baking step) and a step of baking the developed pattern (post-baking step) may be provided, as desired. Hereinafter, the respective steps will be described.

<<Step of Forming Coloring Composition Layer>>

In the step of forming a coloring composition layer, the coloring composition layer is formed on a support, using the coloring composition.

The support is not particularly limited, and can be appropriately selected depending on applications. Examples of the support include a glass base material, a base material for a solid-state imaging element, on which a solid-state imaging element (light-receiving element) such as a CCD and a CMOS is provided, and a silicon base material. Further, an undercoat layer may be provided on the base materials, as desired, so as to improve adhesion to a layer above the base material, to prevent diffusion of substance, or to flatten a surface of the base materials.

As a method for applying the coloring composition onto the support, various coating methods such as slit coating, an ink jet method, spin coating, cast coating, roll coating, and a screen printing method can be used.

The coloring composition layer formed on the support may be dried (pre-baked). In a case of forming a pattern by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. By setting the pre-baking temperature to 150° C. or lower, these characteristics can be more effectively maintained in a case of a configuration in which a photo-electric conversion film of an image sensor is formed of organic materials. The pre-baking time is preferably 10 seconds to 300 seconds, more preferably 40 to 250 seconds, and still more preferably 80 to 220 seconds. Drying can be performed using a hot plate, an oven, or the like.

<<Exposing Step>>

Next, the coloring composition layer formed on the support is patternwise exposed (exposing step). For example, the coloring composition layer can be subjected to patternwise exposure by performing exposure using an exposure device such as a stepper through a mask having a predetermined mask pattern. Thus, the exposed portion can be cured. As the radiation (light) which can be used during the exposure, ultraviolet rays such as g-rays and i-rays (particularly preferably i-rays) are preferably used. The irradiation dose (exposure dose) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. Further, the exposure illuminance can be appropriately set, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the illuminance of exposure energy may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

<<Developing Step>>

Next, the unexposed areas are removed by development to form a pattern. The removal of the unexposed areas by development can be carried out using a developer. Thus, the coloring composition layer of the unexposed areas in the exposing step is eluted into the developer, and as a result, only a photocured portion remains. As the developer, an organic alkali developer causing no damage on the underlying solid-state imaging element, circuit, or the like is preferable. The temperature of the developer is preferably, for example, 20° C. to 30° C., and the development time is preferably 20 to 180 seconds. Further, in order to improve residue removing properties, a step of removing the developer by shaking per 60 seconds and supplying a fresh developer may be repeated multiple times.

As the developer, an aqueous alkaline solution obtained by diluting an alkali agent with pure water is preferably used. Examples of the alkali agent include aqueous ammonia, organic alkaline compounds such as ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. The concentration of the alkali agent in the aqueous alkaline solution is preferably 0.001% to 10% by mass and more preferably 0.01% to 1% by mass. Moreover, the developer may further include a surfactant. Examples of the surfactant include the surfactants described above, and the surfactant is preferably a nonionic surfactant. From the viewpoints of transportation, storage, and the like, the developer may be first produced as a concentrated liquid and then diluted to a concentration required upon the use. The dilution ratio is not particularly limited, and can be set to, for example, a range of 1.5 to 100 times. In addition, in a case where a developer including such an aqueous alkaline solution is used, it is preferable to perform washing (rinsing) with pure water after development.

After the development, a heating treatment (post-baking) can also be performed after carrying out drying. The post-baking is a heating treatment after development so as to complete the curing of the film. In a case of performing the post-baking, the post-baking temperature is preferably, for example, 100 to 240° C. From the viewpoint of curing of the film, the post-baking temperature is more preferably 200 to 230° C. The Young's modulus of the film after post-baking is preferably 0.5 to 20 GPa and more preferably 2.5 to 15 GPa. In addition, in a case where a support is formed of a material having low heat resistance (for example, in a case where the support includes an organic electroluminescence (organic EL) element, an image sensor having a photoelectric conversion film formed of organic materials, or the like), the post-baking temperature is preferably 150° C. or lower, more preferably 120° C. or lower, still more preferably 100° C. or lower, and particularly preferably 90° C. or lower. The lower limit can be set to, for example, 50° C. or higher. The post-baking can be performed continuously or batchwise by using a heating means such as a hot plate, a convection oven (hot-air circulating dryer), and a high-frequency heater so that the film after development (cured film) satisfies the conditions.

The cured film preferably has high flatness. Specifically, the surface roughness Ra is preferably 100 nm or less, more preferably 40 nm or less, and still more preferably 15 nm or less. The lower limit is not specified, but is preferably, for example 0.1 nm or more. The surface roughness can be measured, for example, using an atomic force microscope (AFM) Dimension 3100 manufactured by Veeco Instruments, Inc. In addition, the contact angle of water on the cured film can be appropriately set to a preferred value and is typically in the range of 50 to 110°. The contact angle can be measured, for example, using a contact angle meter CV-DT-A Model (manufactured by Kyowa Interface Science Co., Ltd.).

A higher volume resistivity value of a pattern (pixel) is desired. Specifically, the volume resistivity value of the pixel is preferably $10^9$ Ω·cm or more and more preferably $10^{11}$ Ω·cm or more. The upper limit is not defined, but is, for example, preferably $10^{14}$ Ω·cm or less. The volume resistivity value of the pixel can be measured, for example, using an ultra high resistance meter 5410 (manufactured by Advantest Corporation).

<Solid-State Imaging Element>

The solid-state imaging element of an embodiment of the present invention has the above-mentioned color filter of the embodiment of the present invention. The configuration of the solid-state imaging element of the embodiment of the present invention is not particularly limited as long as the solid-state imaging element is configured to include the color filter in the embodiment of the present invention and function as a solid-state imaging element.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a base material; a light-shielding film having openings only over the light receiving portion of the photodiode, on the photodiodes and the transfer electrodes; a device-protective film formed of silicon nitride or the like, which is formed to coat the entire surface of the light-shielding film and the light receiving portion of the photodiodes, on the light-shielding film; and a color filter on the device-protective film. In addition, the solid-state imaging element may also be configured, for example, such that it has a light collecting means (for example, a microlens, which is the same hereinafter) on a device-protective film under a color filter (a side closer to the base material), or has a light collecting means on a color filter. Further, the color filter may have a structure in which a cured film forming each coloring pixel is embedded in a space partitioned in a lattice shape by a partition wall. The partition wall in this case preferably has a low refractive index for each coloring pixel. Examples of an imaging device having such a structure include the devices described in JP2012-227478A and JP2014-179577A. An imaging device comprising the solid-state imaging element of the embodiment of the present invention can also be used as a vehicle camera or a monitoring camera, in addition to a digital camera or electronic equipment (mobile phones or the like) having an imaging function.

<Image Display Device>

The color filter of the embodiment of the present invention can be used for an image display device such as a liquid crystal display device and an organic electroluminescence display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinbelow, the present invention will be described in more detail with reference to Examples. The materials, the amounts of materials to be used, the proportions, the treatment details, the treatment procedure, or the like shown in the Examples below may be modified appropriately as long as the modifications do not depart from the spirit of the present invention. Therefore, the scope of the present invention is not limited to the specific Examples shown below. In addition, "parts" and "%" are on a mass basis unless otherwise specified.

<Measurement of Average Primary Particle Diameter of Pigment>

Projected areas of a pigment were determined by a transmission electron microscope (a device in accordance with a field emission type transmission electron microscope, manufactured by JEOL Ltd., JEM-2100F Type), and then an equivalent circle diameter of the pigment was determined therefrom to calculate an average primary particle diameter. More specifically, equivalent circle diameters of 100 pigments were measured, and then the equivalent circle diameters were arithmetically averaged for 80 pigments excluding 10 pigments from the largest size and 10 pigments from the smallest size among the 100 pigments to calculate the average primary particle diameter of the pigment.

<Measurement of Weight-Average Molecular Weight>

The weight-average molecular weight (Mw) of a resin is measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow amount (amount of a sample to be injected): 1.0 µL (sample concentration: 0.1% by mass)

Device name: HLC-8220GPC manufactured by Tosoh Corporation

Detector: Refractive index (RI) detector

Calibration curve base resin: Polystyrene resin

Production of Refined Pigment

Production Example 1

50 parts by mass of a magenta pigment (C. I. Pigment Red 122), 500 parts by mass of sodium chloride (OSHIO MICRON MS-5, manufactured by Ako Kasei Co., Ltd.), and 100 parts by mass of diethylene glycol were introduced into a 1-gallon kneader made by stainless steel (manufactured by INOUE MFG, INC.) and kneaded for 9 hours. Next, the mixture was poured into about 3 liters of water, stirred by a high-speed mixer for 1 hour. Thereafter, the mixture is filtered and washed with water to remove sodium chloride and diethylene glycol, and then dried to obtain a refined magenta pigment 1. An average primary particle diameter of the refined magenta pigment 1 was 45 nm.

Production Example 2

In the same manner as Production Example 1, refined magenta pigments 2 to 7 described in the following table were produced.

TABLE 1

| | Type | Average primary particle diameter (nm) |
|---|---|---|
| Refined magenta pigment 1 | C.I. Pigment Red 122 | 45 |
| Refined magenta pigment 2 | C.I. Pigment Red 122 | 35 |
| Refined magenta pigment 3 | C.I. Pigment Red 122 | 25 |
| Refined magenta pigment 4 | C.I. Pigment Red 202 | 45 |
| Refined magenta pigment 5 | C.I. Pigment Red 209 | 45 |
| Refined magenta pigment 6 | C.I. Pigment Violet 23 | 45 |
| Refined magenta pigment 7 | C.I. Pigment Violet 19 | 45 |

A maximum absorption wavelength of C. I. Pigment Red 122 was 565 nm, and in a case where an absorbance of the maximum absorption wavelength was 1, a wavelength at which an absorbance is 0.5 was 510 nm on a side where the wavelength was shorter than the maximum absorption wavelength, and in a case where the absorbance of the maximum absorption wavelength was 1, a wavelength at which an absorbance is 0.5 was 585 nm on a side where the wavelength was longer than the maximum absorption wavelength.

A maximum absorption wavelength of C. I. Pigment Red 202 was 575 nm, and in a case where an absorbance of the maximum absorption wavelength was 1, a wavelength at which an absorbance is 0.5 was 555 nm on a side where the wavelength was shorter than the maximum absorption wavelength, and in a case where the absorbance of the maximum absorption wavelength was 1, a wavelength at which an absorbance is 0.5 was 615 nm on a side where the wavelength was longer than the maximum absorption wavelength.

A maximum absorption wavelength of C. I. Pigment Red 209 was 510 nm, and in a case where an absorbance of the maximum absorption wavelength was 1, a wavelength at which an absorbance is 0.5 was 480 nm on a side where the wavelength was shorter than the maximum absorption wavelength, and in a case where the absorbance of the maximum absorption wavelength was 1, a wavelength at which an absorbance is 0.5 was 590 nm on a side where the wavelength was longer than the maximum absorption wavelength.

A maximum absorption wavelength of C. I. Pigment Violet 23 was 535 nm, and in a case where an absorbance of the maximum absorption wavelength was 1, a wavelength at which an absorbance is 0.5 was 505 nm on a side where the wavelength was shorter than the maximum absorption wavelength, and in a case where the absorbance of the maximum absorption wavelength was 1, a wavelength at which an absorbance is 0.5 was 590 nm on a side where the wavelength was longer than the maximum absorption wavelength.

A maximum absorption wavelength of C. I. Pigment Violet 19 was 565 nm, and in a case where an absorbance of the maximum absorption wavelength was 1, a wavelength at which an absorbance is 0.5 was 510 nm on a side where the wavelength was shorter than the maximum absorption wavelength, and in a case where the absorbance of the maximum absorption wavelength was 1, a wavelength at which an absorbance is 0.5 was 585 nm on a side where the wavelength was longer than the maximum absorption wavelength.

<Preparation of Pigment Dispersion Liquid>

Raw materials described in the following table were mixed to obtain a mixed solution. The obtained mixed solution was subjected to a dispersion treatment by using Ultra apex mill (trade name) manufactured by Kotobuki Industries Co., Ltd. as a circulation type dispersion apparatus (beads mill) to obtain a dispersion liquid. The solid content of the obtained dispersion liquid was 20.0% by mass.

TABLE 2

|  | Pigment dispersion liquid 1 | Pigment dispersion liquid 2 | Pigment dispersion liquid 3 | Pigment dispersion liquid 4 | Pigment dispersion liquid 5 | Pigment dispersion liquid 6 | Pigment dispersion liquid 7 | Pigment dispersion liquid 8 | Pigment dispersion liquid 9 | Pigment dispersion liquid 10 | Pigment dispersion liquid 11 |
|---|---|---|---|---|---|---|---|---|---|---|---|
| Refined magenta pigment 1 | 142.9 |  |  |  |  |  | 142.9 | 142.9 |  |  |  |
| Refined magenta pigment 2 |  | 142.9 |  |  |  |  |  |  |  |  |  |
| Refined magenta pigment 3 |  |  | 142.9 |  |  |  |  |  |  |  |  |
| Refined magenta pigment 4 |  |  |  | 142.9 |  |  |  |  |  |  |  |
| Refined magenta pigments 5 |  |  |  |  | 142.9 |  |  |  |  |  |  |
| Refined magenta pigment 6 |  |  |  |  |  | 142.9 |  |  |  |  |  |
| Refined magenta pigment 7 |  |  |  |  |  |  |  |  | 142.9 | 142.9 | 142.9 |
| Dispersant 1 | 57.1 | 57.1 | 57.1 | 57.1 | 57.1 | 57.1 |  |  | 57.1 |  |  |
| Dispersant 2 |  |  |  |  |  |  | 57.1 |  |  |  |  |
| Dispersant 3 |  |  |  |  |  |  |  | 57.1 |  |  |  |
| Dispersant 4 |  |  |  |  |  |  |  |  |  | 57.1 |  |
| Dispersant 5 |  |  |  |  |  |  |  |  |  |  | 57.1 |
| PGMEA | 680.0 | 680.0 | 680.0 | 680.0 | 680.0 | 680.0 | 680.0 | 680.0 | 680.0 | 680.0 | 680.0 |
| PGME | 120.0 | 120.0 | 120.0 | 120.0 | 120.0 | 120.0 | 120.0 | 120.0 | 120.0 | 120.0 | 120.0 |
| Total amount | 1000.0 | 1000.0 | 1000.0 | 1000.0 | 1000.0 | 1000.0 | 1000.0 | 1000.0 | 1000.0 | 1000.0 | 1000.0 |

The numerical values described in the above table are parts by mass and the raw materials described in the above table are as follows.

Refined magenta pigments 1 to 7: Above-mentioned refined magenta pigments 1 to 7

Dispersant 1: Resin of the following structure (Mw=20,000, acid value=36.0 mgKOH/g, amine value=47.0 mgKOH/g, the numerical value described together with the main chain is a molar ratio and the numerical value together with the repeating unit is the repeating number)

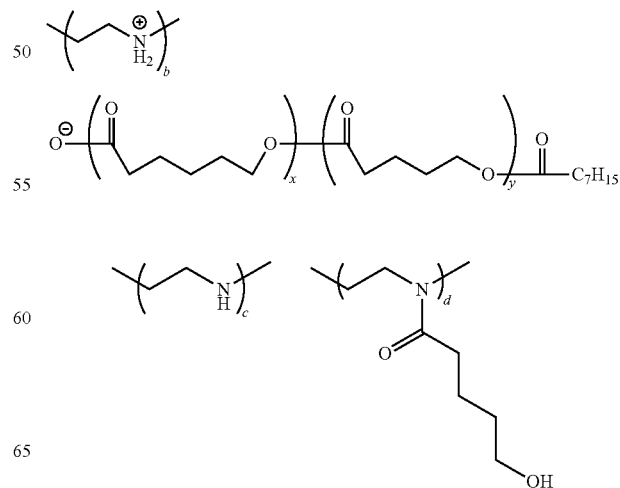

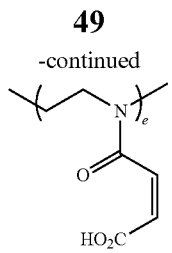

a/b/c/d/e = 36/4/35/1/24 (mol %)
x = 48 y = 12

Dispersant 2: Resin of the following structure (Mw=20,000, acid value=32.3 mgKOH/g, amine value=45.0 mgKOH/g, the numerical value described together with the main chain is a molar ratio and the numerical value together with the repeating unit is the repeating number)

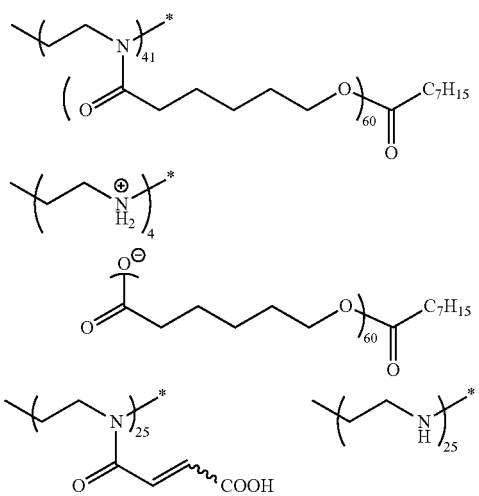

Dispersant 3: Resin of the following structure (Mw=24,000, acid value=49.4 mgKOH/g, amine value=0.0 mgKOH/g, the numerical value described together with the main chain is a molar ratio and the numerical value together with the repeating unit is the repeating number)

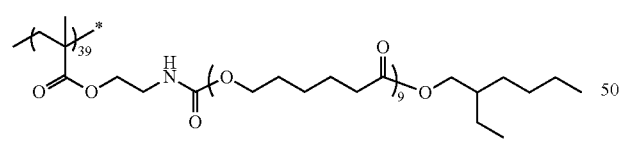

Dispersant 4: Resin of the following structure (Mw=21,000, acid value=72.0 mgKOH/g, amine value=0.0 mgKOH/g, the numerical value described together with the main chain is a molar ratio and the numerical value together with the repeating unit is the repeating number)

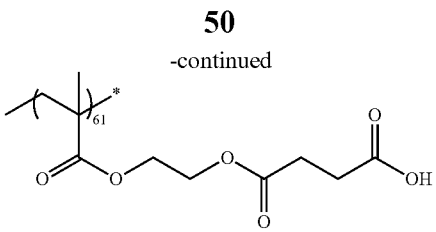

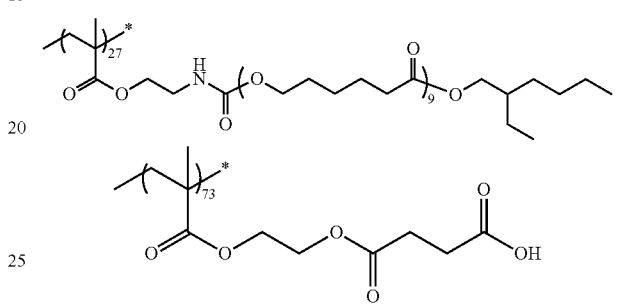

Dispersant 5: Resin of the following structure (Mw=21,000, acid value=94.8 mgKOH/g, amine value=0.0 mgKOH/g, the numerical value described together with the main chain is a molar ratio and the numerical value together with the repeating unit is the repeating number)

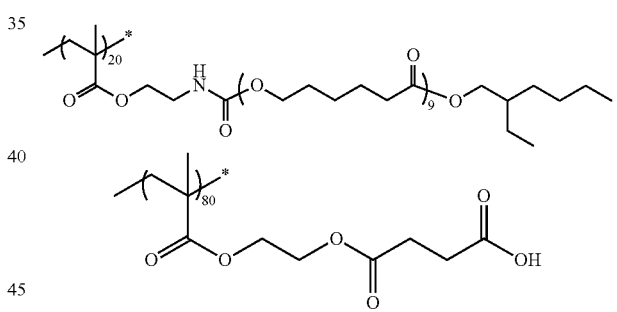

PGMEA: Propylene glycol monomethyl ether acetate
PGME: Propylene glycol monomethyl ether <Preparation of Coloring Composition>

The raw materials described in the following table were mixed to prepare a coloring composition (a magenta coloring composition).

TABLE 3

| | Example 1 | Example 2 | Example 3 | Example 4 | Example 5 | Example 6 | Example 7 | Example 8 | Example 9 | Example 10 | Example 11 | Example 12 | Example 13 | Example 14 | Comparative Example 1 |
|---|---|---|---|---|---|---|---|---|---|---|---|---|---|---|---|
| Pigment dispersion liquid 1 | 67.69 | | | | | | | | 67.69 | | | | | | 67.69 |
| Pigment dispersion liquid 2 | | 67.69 | | | | | | | | | | | | | |
| Pigment dispersion liquid 3 | | | 67.69 | | | | | | | | | | | | |

TABLE 3-continued

| | Example 1 | Example 2 | Example 3 | Example 4 | Example 5 | Example 6 | Example 7 | Example 8 | Example 9 | Example 10 | Example 11 | Example 12 | Example 13 | Example 14 | Comparative Example 1 |
|---|---|---|---|---|---|---|---|---|---|---|---|---|---|---|---|
| Pigment dispersion liquid 4 | | | 67.69 | | | | | | | | | | | | |
| Pigment dispersion liquid 5 | | | | 67.69 | | | | | | | | | | | |
| Pigment dispersion liquid 6 | | | | | 67.69 | | | | | | | | | | |
| Pigment dispersion liquid 7 | | | | | | 67.69 | | | | | | | | | |
| Pigment dispersion liquid 8 | | | | | | | 67.69 | | | | | | | | |
| Pigment dispersion liquid 9 | | | | | | | | | 67.69 | | | | | | |
| Pigment dispersion liquid 10 | | | | | | | | | | 67.69 | | | | | |
| Pigment dispersion liquid 11 | | | | | | | | | | | 67.69 | 67.69 | 67.69 | | |
| Alkali-soluble resin 1 | 0.65 | 0.65 | 0.65 | 0.65 | 0.65 | 0.65 | 0.65 | 0.65 | 0.65 | 0.65 | 0.65 | 0.65 | 0.65 | | 0.65 |
| Alkali-soluble resin 2 | | | | | | | | | | | | | | 0.65 | |
| Polymerizable compound 1 | 1.86 | 1.86 | 1.86 | 1.86 | 1.86 | 1.86 | 1.86 | 1.86 | 1.86 | 1.86 | 1.86 | 1.86 | | | 1.86 |
| Polymerizable compound 2 | | | | | | | | | | | | | 1.86 | 1.86 | |
| Photopolymerization initiator 1 | 0.67 | 0.67 | 0.67 | 0.67 | 0.67 | 0.67 | 0.67 | 0.67 | 0.67 | 0.67 | 0.67 | 0.67 | 0.67 | 0.67 | 0.67 |
| Ultraviolet absorber 1 | 0.43 | 0.43 | 0.43 | 0.43 | 0.43 | 0.43 | 0.43 | 0.43 | | 0.43 | 0.43 | 0.43 | 0.43 | 0.43 | |
| Ultraviolet absorber 2 | | | | | | | | | 0.43 | | | | | | |
| Polymerization inhibitor 1 | 0.01 | 0.01 | 0.01 | 0.01 | 0.01 | 0.01 | 0.01 | 0.01 | 0.01 | 0.01 | 0.01 | 0.01 | 0.01 | 0.01 | 0.01 |
| Surfactant 1 | 0.01 | 0.01 | 0.01 | 0.01 | 0.01 | 0.01 | 0.01 | 0.01 | 0.01 | 0.01 | 0.01 | 0.01 | 0.01 | 0.01 | 0.01 |
| PGMEA | 28.68 | 28.68 | 28.68 | 28.68 | 28.68 | 28.68 | 28.68 | 28.68 | 28.68 | 28.68 | 28.68 | 28.68 | 28.68 | 28.68 | 28.68 |

The numerical values described in the above table are parts by mass and the raw materials described in the above table are as follows.

Pigment dispersion liquids 1 to 11: Above-mentioned pigment dispersion liquids 1 to 11

Alkali-soluble resin 1: Acrycure RD-F8 (manufactured by Nippon Shokubai Co., Ltd., an alkali-soluble resin having polymerizable group)

Alkali-soluble resin 2: Resin of the following structure (Mw=11,000, acid value=216.6 mgKOH/g, the numerical value described together with the main chain is a molar ratio and the numerical value together with the repeating unit is the repeating number)

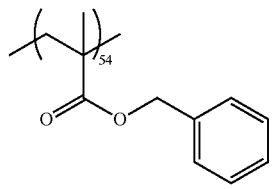 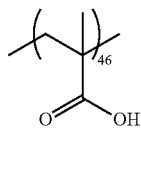

Polymerizable compound 1: NK ESTER A-TMMT (manufactured by Shin-Nakamura Chemical Co., Ltd.)

Polymerizable compound 2: OGSOL EA-0300 (manufactured by Osaka Gas Chemicals Co., Ltd.)

Photopolymerization initiator 1: IRGACURE OXE-02 (manufactured by BASF)

Ultraviolet absorber 1: Compound having the following structure

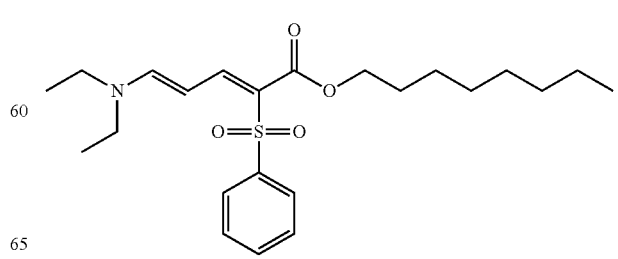

Ultraviolet absorber 2: Compound having the following structure

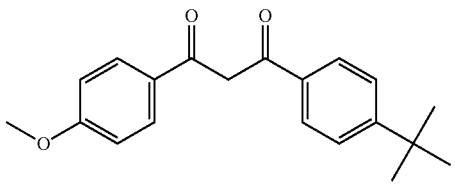 [SMILES: COc1ccc(C(=O)CC(=O)c2ccc(C(C)(C)C)cc2)cc1]

Polymerization inhibitor 1: p-Methoxyphenol
Surfactant 1: Following compound (Mw=14,000, % representing the ratio of the repeating unit is % by mole.)

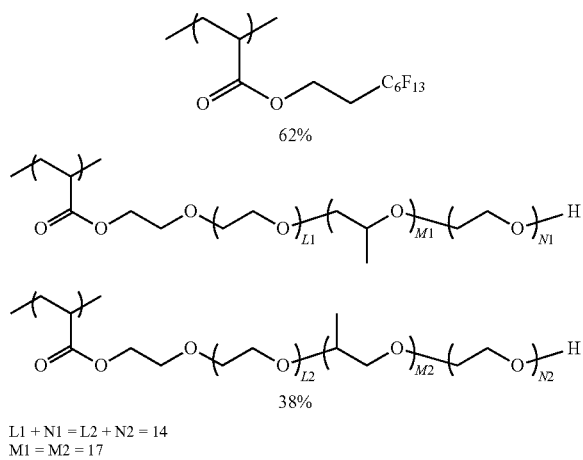

$L1 + N1 = L2 + N2 = 14$
$M1 = M2 = 17$

PGMEA: Propylene glycol monomethyl ether acetate
<Preparation of Cyan Coloring Composition>
A refined cyan pigment was obtained in the same manner as Production Example 1 except that an aluminum phthalocyanine pigment (cyan pigment) was used instead of C. I. Pigment Red 122. An average primary particle diameter of the refined cyan pigment was 45 nm.

A cyan pigment dispersion liquid was prepared in the same manner as the preparation of the pigment dispersion liquid 1 except that the refined cyan pigment was used instead of the refined magenta pigment 1 in the preparation of the pigment dispersion liquid 1.

A cyan coloring composition 1 was prepared in the same manner as the preparation of the coloring composition in Example 1 (magenta coloring composition) except that the cyan pigment dispersion liquid was used instead of the pigment dispersion liquid 1 in the preparation of the coloring composition in Example 1 (magenta coloring composition).

In addition, a cyan coloring composition 2 was prepared in the same manner as the preparation of the cyan coloring composition 1 except that C. I. Pigment Blue 16 was used instead of aluminum phthalocyanine pigment.

<Preparation of Yellow Coloring Composition>
A refined yellow pigment was obtained in the same manner as Production Example 1 except that C. I. Pigment Yellow 150 (yellow pigment) was used instead of C. I. Pigment Red 122. An average primary particle diameter of the refined yellow pigment was 45 nm.

A yellow pigment dispersion liquid was prepared in the same manner as the preparation of the pigment dispersion liquid 1 except that the refined yellow pigment was used instead of the refined magenta pigment 1 in the preparation of the pigment dispersion liquid 1.

A yellow coloring composition was prepared in the same manner as the preparation of the coloring composition in Example 1 (magenta coloring composition) except that the yellow pigment dispersion liquid was used instead of the pigment dispersion liquid 1 in the preparation of the coloring composition in Example 1 (magenta coloring composition).

<Evaluation Test of Photolithographic Properties>
The coloring compositions (the magenta coloring compositions) described in Examples and Comparative Example obtained by the above-mentioned method were applied onto an 8 inches (203.2 mm) silicon wafer with an undercoat layer by a spin coating method using Act 8 manufactured by Tokyo Electron Limited. so that the film thickness after the coating was 0.5 μm, and then heated at 100° C. for 2 minutes using a hot plate to form a composition layer. Next, the obtained composition layer was exposed to light (exposure dose: 50 to 1,700 mJ/cm$^2$) by using an i-rays stepper exposure device (FPA-3000 i5+, manufactured by Canon Inc.) through a mask having a pattern of 1.0 μm square. Next, the exposed composition layer was shower-developed at 23° C. for 60 seconds using a 0.3% by mass of aqueous solution of tetramethylammonium hydroxide (TMAH) as a developer. Thereafter, rinsing was performed with pure water by spin shower to form a pattern (a magenta coloring pixel).

The obtained pattern was observed at 20,000 times magnification by using a scanning electron microscope (S-4800H, manufactured by Hitachi High-Technologies Corporation.). Based on the observed image, photolithographic properties were evaluated by the following standard. The evaluation test of photolithographic properties was performed 3 times for each coloring composition and the result was collected and determined.

5: The pattern is clear and there is no residue between the patterns.
4: The pattern is clear and there is a small residue between the patterns.
3: The pattern is slightly taper shaped, but there is a small residue between the patterns.
2: The pattern is taper shaped, and there is a lot of residue between the patterns.
1: The pattern is not formed.

<Evaluation Test of Photolithographic Properties 2>
The coloring compositions (the magenta coloring compositions) described in Examples and Comparative Example obtained by the above-mentioned method were applied onto an 8 inches (203.2 mm) silicon wafer with an undercoat layer by a spin coating method using Act 8 manufactured by Tokyo Electron Limited. so that the film thickness after the coating was 0.5 μm, and then heated at 100° C. for 2 minutes using a hot plate to form a composition layer. Next, the obtained composition layer was exposed to light (exposure dose: 50 to 1,700 mJ/cm$^2$) through a mask having a pattern of 0.9 μm square by using an i-rays stepper exposure device (FPA-3000 i5+, manufactured by Canon Inc.). Next, the exposed composition layer was shower-developed at 23° C. for 60 seconds using a 0.3% by mass of aqueous solution of tetramethylammonium hydroxide (TMAH) as a developer. Thereafter, rinsing was performed with pure water by spin shower to form a pattern (a magenta coloring pixel).

The obtained pattern was observed at 20,000 times magnification by using a scanning electron microscope (S-4800H, manufactured by Hitachi High-Technologies Corporation.). Based on the observed image, photolithographic properties were evaluated by the following standard.

The evaluation test of photolithographic properties was performed 3 times for each coloring composition and the result was collected and determined.

5: The pattern is clear and there is no residue between the patterns.

4: The pattern is clear and there is a small residue between the patterns.

3: The pattern is slightly taper shaped, but there is a small residue between the patterns.

2: The pattern is taper shaped, and there is a lot of residue between the patterns.

1: The pattern is not formed.

<Evaluation Test of Mixed Color>

A pattern (magenta coloring pixel) was formed on the 8 inches (203.2 mm) silicon wafer with the undercoat layer in the same manner as the evaluation test of photolithographic properties using the coloring composition (magenta coloring composition) described in Examples and Comparative Example obtained by the above-mentioned method.

Transmittance (spectrum 1) of the pattern in a range of 400 to 700 nm was measured by using a spectrometer system (LVmicro V, manufactured by Lambda Vision Inc.).

Next, each of the cyan coloring pattern (cyan coloring pixel) and yellow coloring pattern (yellow coloring pixel) was formed on a pixel omission part of the magenta coloring pixel on the silicon wafer of a glass wafer on which the magenta coloring pixel was formed, by using the cyan coloring composition 1 and the yellow coloring composition in the same manner as the evaluation test of photolithographic properties, and then transmittance of the magenta coloring pixel was measured (spectrum 2).

A maximum value of the variation of transmittance was determined by using the spectrums 1 and 2 of the magenta coloring pixel, and the mixed color was evaluated by the following standard.

In addition, the measurement of transmittance was performed 5 times for each sample, and the average value of the 3 times result except the maximum value and the minimum value was adopted. Furthermore, the maximum value of the variation of transmittance means a variation of transmittance of the magenta coloring pixel in a wavelength which has the largest variation of transmittance in a range of 400 to 700 nm before and after forming other coloring pixels.

5: Maximum value of variation of transmittance is less than 2%

4: Maximum value of variation of transmittance is 2% or more and less than 3%

3: Maximum value of variation of transmittance is 3% or more and less than 4%

2: Maximum value of variation of transmittance is 4% or more and less than 5%

1: Maximum value of variation of transmittance is 5% or more

<Light Resistance Evaluation>

The coloring compositions (magenta coloring compositions) described in Examples and Comparative Example were applied onto a soda glass (75 mm×75 mm square, 1.1 mm thickness) by a spin coater (H-360S, manufactured by MIKASA CO., LTD.). Next, the coloring composition was prebaked at 100° C. for 2 minutes by using a hot plate to obtain a coating film. The obtained coating film was exposed to light in an exposure dose 1,000 mJ/cm² by an ultra-high pressure mercury lamp (USH-500BY, manufactured by USHIO INC.). Subsequently, the coating film after exposure was heated at 200° C. for 5 minutes on a hot plate in an air atmosphere to obtain a cured film having a film thickness of 0.5 μm. Light transmittance (transmittance) of the obtained cured film in a range of 400 to 700 nm was measured by using MCPD-3000 manufactured by OTSUKA ELECTRONICS Co., LTD.

Next, a UV cut filter (manufactured by AS ONE Corporation, KU-1000100) was mounted on the produced cured film and a light resistance test was performed by using a weather meter (manufactured by Suga Test Instruments Co., Ltd., Xenon Weather Meter SX75) to irradiating light of 100,000 lx for 50 hours (cumulative irradiation dose: 5,000,000 lxh). The temperature of the cured film (temperature in test apparatus) was set to 63° C. The relative humidity in the test apparatus was set to 50%. After performing the light resistance test, the transmittance of the cured film was measured, the maximum value of variation of transmittance was determined, and then the light resistance was evaluated based on the following standard.

In addition, the measurement of transmittance was performed 5 times for each sample, and the average value of the 3 times result except the maximum value and the minimum value was adopted. Furthermore, the maximum value of the variation of transmittance means a variation of transmittance of the cured film in a wavelength which has the largest variation of transmittance in a range of 400 to 700 nm before and after the light resistance test.

5: Maximum value of variation of transmittance is 3% or less

4: Maximum value of variation of transmittance is more than 3% and 5% or less

3: Maximum value of variation of transmittance is more than 5% and 7% or less

2: Maximum value of variation of transmittance is more than 7% and 10% or less

1: Maximum value of variation of transmittance is more than 10%

TABLE 4

| | Photolithographic properties | Mixed color | Light resistance | Photolithographic properties 2 |
|---|---|---|---|---|
| Example 1 | 4 | 5 | 5 | 3 |
| Example 2 | 5 | 5 | 5 | 4 |
| Example 3 | 5 | 5 | 4 | 4 |
| Example 4 | 4 | 5 | 4 | 3 |
| Example 5 | 4 | 5 | 4 | 3 |
| Example 6 | 4 | 5 | 4 | 3 |
| Example 7 | 3 | 5 | 5 | 3 |
| Example 8 | 4 | 5 | 5 | 3 |
| Example 9 | 4 | 5 | 5 | 3 |
| Example 10 | 4 | 5 | 5 | 3 |
| Example 11 | 5 | 5 | 5 | 4 |
| Example 12 | 5 | 5 | 5 | 5 |
| Example 13 | 5 | 5 | 5 | 5 |
| Example 14 | 5 | 5 | 5 | 5 |
| Comparative Example 1 | 1 | 2 | 2 | 1 |

As shown in the above table, the coloring compositions of Examples were excellent in photolithographic properties and capable of suppressing an occurrence of mixed color between adjacent pixels of other hues.

The same result was obtained in a case where the same test was performed using the cyan coloring composition 2 instead of the cyan coloring composition 1.

In the coloring composition of each example, the same effect can be obtained by using two or more of the ultraviolet absorbers in combination described in the present specification.

What is claimed is:

1. A photosensitive coloring composition comprising:
   a magenta pigment having an average primary particle diameter of 20 nm or more and 50 nm or less;
   a polymerizable compound;
   a photopolymerization initiator; and
   an ultraviolet absorber,
   wherein the photosensitive coloring composition does not substantially contain a colorant other than the magenta pigment,
   the magenta pigment has a maximum absorption wavelength in a range of 500 to 600 nm, and
   in a case where an absorbance of the maximum absorption wavelength is 1, a wavelength at which an absorbance is 0.5 is 450 nm or more on a side where a wavelength is shorter than the maximum absorption wavelength, and is 650 nm or less on a side where a wavelength is longer than the maximum absorption wavelength.

2. The photosensitive coloring composition according to claim 1,
   wherein the magenta pigment is a compound having a coloring agent skeleton selected from a quinacridone skeleton and a dioxazine skeleton.

3. The photosensitive coloring composition according to claim 1,
   wherein in the case where the absorbance of the maximum absorption wavelength is 1, the magenta pigment has a difference of 130 nm or less between the wavelengths at which the absorbance is 0.5 on the side where a wavelength is longer than the maximum absorption wavelength and on the side where a wavelength is shorter than the maximum absorption wavelength.

4. The photosensitive coloring composition according to claim 1,
   wherein a content of the ultraviolet absorber is 1% to 20% by mass with respect to the total solid content of the photosensitive coloring composition.

5. The photosensitive coloring composition according to claim 1,
   wherein the photosensitive coloring composition contains 10 to 500 parts by mass of the ultraviolet absorber with respect to 100 parts by mass of the photopolymerization initiator.

6. The photosensitive coloring composition according to claim 1,
   wherein the photosensitive coloring composition contains 1 to 40 parts by mass of the ultraviolet absorber with respect to 100 parts by mass of the magenta pigment.

7. The photosensitive coloring composition according to claim 1, further comprising a resin having an amine value.

8. The photosensitive coloring composition according to claim 7,
   wherein the resin having an amine value is a resin having a nitrogen atom in a main chain.

9. The photosensitive coloring composition according to claim 7,
   wherein the resin having an amine value is a resin having an acid value and an amine value, and
   the acid value is 30 mgKOH/g or more.

10. The photosensitive coloring composition according to claim 1, further comprising a resin having an acid value of 50 mgKOH/g or more.

11. The photosensitive coloring composition according to claim 1, further comprising a resin having an acid value of 80 mgKOH/g or more.

12. The photosensitive coloring composition according to claim 1, further comprising an alkali-soluble resin having a polymerizable group.

13. The photosensitive coloring composition according to claim 1,
    wherein the magenta pigment is at least one pigment selected from Color Index Pigment Red 122, Color Index Pigment Red 202, Color Index Pigment Red 209, Color Index Pigment Red 269, Color Index Pigment Violet 19, or Color Index Pigment Violet 23.

14. The photosensitive coloring composition according to claim 1, which is used for forming a magenta coloring pixel in a color filter.

15. A cured film obtained from the photosensitive coloring composition according to claim 1.

16. A color filter comprising the cured film according to claim 15.

17. A color filter comprising a magenta coloring pixel obtained from the photosensitive coloring composition according to claim 1, a cyan coloring pixel, and a yellow coloring pixel.

18. A solid-state imaging element comprising the color filter according to claim 16.

19. An image display device comprising the color filter according to claim 16.

20. A magenta coloring pixel obtained from a photosensitive coloring composition,
    wherein the photosensitive coloring composition includes:
      a magenta pigment having an average primary particle diameter of 20 nm or more and 50 nm or less;
      a polymerizable compound;
      a photopolymerization initiator; and
      an ultraviolet absorber, and
    wherein the photosensitive coloring composition does not substantially contain a colorant other than the magenta pigment,
    the magenta pigment has a maximum absorption wavelength in a range of 500 to 600 nm, and
    in a case where an absorbance of the maximum absorption wavelength is 1, a wavelength at which an absorbance is 0.5 is 450 nm or more on a side where a wavelength is shorter than the maximum absorption wavelength, and is 650 nm or less on a side where a wavelength is longer than the maximum absorption wavelength.

\* \* \* \* \*